United States Patent
Tsai et al.

(10) Patent No.: US 12,243,826 B2
(45) Date of Patent: Mar. 4, 2025

(54) METHOD FOR MANUFACTURING SEMICONDUCTOR STRUCTURE HAVING RAISED VIA CONTACTS

(71) Applicant: TAIWAN SEMICONDUCTOR MANUFACTURING COMPANY, LTD., Hsinchu (TW)

(72) Inventors: Kuo-Chiang Tsai, Hsinchu (TW); Jyh-Huei Chen, Hsinchu (TW); Jye-Yen Cheng, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 98 days.

(21) Appl. No.: 17/871,535

(22) Filed: Jul. 22, 2022

(65) Prior Publication Data
US 2022/0367368 A1 Nov. 17, 2022

Related U.S. Application Data

(60) Continuation of application No. 17/093,947, filed on Nov. 10, 2020, now Pat. No. 11,424,188, which is a
(Continued)

(51) Int. Cl.
*H01L 23/538* (2006.01)
*H01L 21/768* (2006.01)
(Continued)

(52) U.S. Cl.
CPC .... *H01L 23/5384* (2013.01); *H01L 21/76802* (2013.01); *H01L 21/76877* (2013.01); *H01L 23/53257* (2013.01); *H01L 29/4175* (2013.01)

(58) Field of Classification Search
CPC ........... H01L 23/5384; H01L 23/53257; H01L 23/5226; H01L 23/5283; H01L 23/485;
(Continued)

(56) References Cited

U.S. PATENT DOCUMENTS 6,847,077 B2 1/2005 Thomas et al.
8,772,109 B2 7/2014 Colinge
(Continued)

*Primary Examiner* — Dao H Nguyen
(74) *Attorney, Agent, or Firm* — Birch, Stewart, Kolasch & Birch, LLP

(57) ABSTRACT

Semiconductor structures and method for manufacturing the same are provided. The method includes forming a first conductive structure over a substrate and forming a second conductive structure through a dielectric layer over the first conductive structure. The method further includes partially removing the dielectric layer to reduce a thickness of the dielectric layer along a first direction and forming a third conductive structure over the second conductive structure. In addition, a first portion of the third conductive structure is within a projection area of the second conductive structure along the first direction, and a second portion of the third conductive structure is outside the projection area of the second conductive structure along the first direction, and a first bottom surface of the first portion is spaced apart from a second bottom surface of the second portion by a distance along the first direction.

20 Claims, 17 Drawing Sheets

Related U.S. Application Data division of application No. 16/164,054, filed on Oct. 18, 2018, now Pat. No. 10,840,189.

(60) Provisional application No. 62/711,916, filed on Jul. 30, 2018.

(51) Int. Cl.
*H01L 23/532* (2006.01)
*H01L 29/417* (2006.01)

(58) Field of Classification Search
CPC ......... H01L 21/76802; H01L 21/76877; H01L 21/76885; H01L 29/4175; H01L 29/517; H01L 29/66545; H01L 29/78
See application file for complete search history.

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,859,386 B2 | 10/2014 | Lu et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,847,355 B2 | 12/2017 | Takayama et al. | |
| 2005/0186801 A1* | 8/2005 | Uno | H01L 21/02126 257/E21.252 |
| 2007/0264824 A1 | 11/2007 | Siew et al. | |
| 2008/0265417 A1* | 10/2008 | Kawamura | H01L 21/76843 438/653 |
| 2009/0194825 A1 | 8/2009 | Werner et al. | |
| 2010/0330764 A1 | 12/2010 | Akiyama et al. | |
| 2011/0298021 A1* | 12/2011 | Tada | H01L 21/02126 257/288 |
| 2013/0082393 A1* | 4/2013 | Kawamura | H01L 23/53295 257/773 |
| 2013/0277749 A1* | 10/2013 | Kura | H10B 12/31 438/275 |
| 2017/0278747 A1* | 9/2017 | Adusumilli | H01L 21/76897 |
| 2018/0040511 A1 | 2/2018 | Kamineni et al. | |
| 2018/0174904 A1 | 6/2018 | Hsieh et al. | |
| 2021/0020572 A1* | 1/2021 | Kawamura | H01L 21/76805 |

* cited by examiner

METHOD FOR MANUFACTURING SEMICONDUCTOR STRUCTURE HAVING RAISED VIA CONTACTS

PRIORITY CLAIM AND CROSS-REFERENCE

This application is a Continuation of U.S. patent application Ser. No. 17/093,947, filed Nov. 10, 2020, which is a Divisional of pending U.S. patent application Ser. No. 16/164,054, filed Oct. 18, 2018, which claims the benefit of U.S. Provisional Application No. 62/711,916, filed on Jul. 30, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
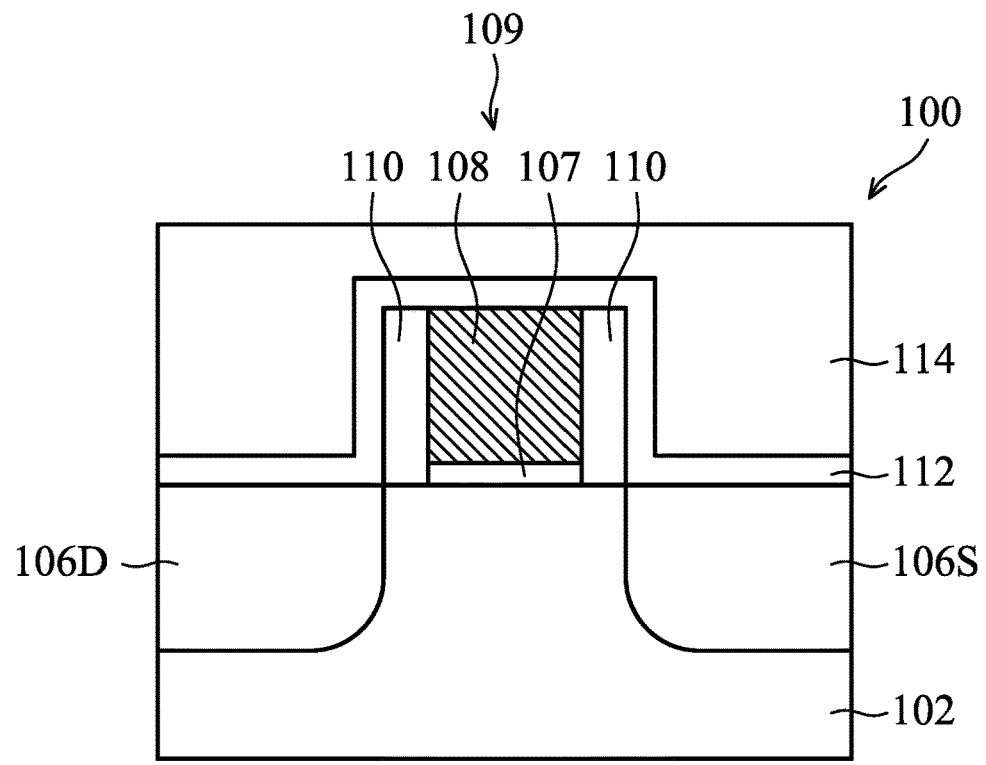
FIGS. 1A-1M show cross-sectional views of intermediate structures at various stages of an exemplary method for fabricating an integrated circuit device having raised via contacts for a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to fabricating integrated circuit devices having multiple raised via contacts for a semiconductor device, multiple raised vias for an interconnect structure, or a combination thereof. The raised via contacts and the raised vias are partially disposed in respective interlayer dielectric (ILD) layers and have respective upper portions protruding from the top surface of the ILD layer. The via contacts and the vias of the embodiments of the disclosure are raised relative to the respective ILD layers. The raised via contacts are also referred to as sawtooth via contacts. Also, the raised vias are referred to as sawtooth vias.

In some embodiments, the raised via contacts are formed in a middle-end-of-line (MEOL) process for a semiconductor device. The semiconductor device is for example Fin Field Effect Transistor (FinFET), planar FET, π-gate FET, Ω-gate FET, Gate-All-Around (GAA) FET, complementary metal-oxide-semiconductor (CMOS) image sensor, or another semiconductor device. For the semiconductor device, the raised via contacts are electrically connected to the contacts of a source region, a drain region and a gate electrode, respectively. Thereafter, the lowest metal layer of an interconnect structure is formed over and is electrically connected to the raised via contacts. The lowest metal layer includes multiple metal lines that are in contact with the raised via contacts, respectively.

In some embodiments, the raised vias are formed in a back-end-of-line (BEOL) process for an integrated circuit device. The integrated circuit device includes various active components and passive components. The active components may be photodiodes, planar FETs, FinFETs, or other transistors. The passive components are, for example, resistors, capacitors, and inductors. The active components and the passive components of the integrated circuit device are electrically coupled through an interconnect structure. The interconnect structure includes multiple metal layers and multiple via layers between the metal layers. The raised vias can be one or more via layers of the interconnect structure. The raised vias are disposed between two metal layers of the interconnect structure for electrically coupling the two metal layers.

According to the embodiments of disclosure, the raised via contacts (or vias) can improve isolation between a via contact (or via) and a metal line that is disposed on another adjacent via contact (or via). The raised via contacts (or vias) can also prevent a bridge between the via contact (or via)

and the metal line that is disposed on the adjacent via contact (or via). Moreover, the raised via contacts (or vias) can increase the contact area between a via contact (or via) and a metal line that is disposed directly on the via contact (or via). Therefore, the contact resistance (Rc) of a via contact (or via) and the metal line directly on the via contact (or via) is reduced.

As the integrated circuit industry has progressed into multiple technology nodes of 20 nm (N20), 16 nm (N16), 10 nm (N10) and beyond, there is less and less space between via contacts (or vias). Also, there is less and less space between metal lines. According to the embodiments of disclosure, the raised via contacts (or vias) can enlarge the space between a via contact (or via) and a metal line on an adjacent via contact (or via). The process window of fabricating the via contacts (or vias) and the metal lines is thereby enlarged. The electrical isolation between a via contact (or via) and a metal line that is disposed on another adjacent via contact (or via) is also improved. A bridge between the via contact (or via) and the metal line is thereby prevented. According to the benefits mentioned above, the embodiments of the disclosure are applicable for integrated circuit devices at technology nodes of N20, N16, N10, 7 nm (N7) and beyond.

The foregoing broadly outlines some aspects of the embodiments described herein. Some embodiments described herein are described in the context of via contacts for a transistor device, and in the context of vias and metal lines in an interconnect structure for an integrated circuit device. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

FIGS. 1A-1M show cross-sectional views of intermediate structures at various stages of an exemplary method for fabricating an integrated circuit device 200, in accordance with some embodiments. Firstly, a semiconductor device 100 is provided, as shown in FIG. 1A in accordance with some embodiments. The semiconductor device 100 may be a Field Effect Transistor (FET), for example a planar FET, a FinFET or another device. The semiconductor device 100 includes a source region 106S, a drain region 106D and a gate structure 109. The source region 106S and the drain region 106D are disposed at opposite sides of the gate structure 109.

In some embodiments, the semiconductor device 100 is a planar FET, the source region 106S and the drain region 106D are formed in a substrate 102, and the gate structure 109 is formed on the substrate 102. In some embodiments, the semiconductor device 100 is a FinFET. The FinFET includes multiple fins protruding from a substrate 102. The source region 106S and the drain region 106D may be epitaxial structures formed in the fin, and the gate structure 109 is formed on the top surface of the fin and along the sidewalls of the fin. The longitudinal direction of the gate structure 109 is perpendicular to the longitudinal direction of the fin.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The substrate 102 may be a bulk semiconductor substrate, a semiconductor-on-insulator (SOI) substrate, or another semiconductor substrate, which may be doped (e.g., with a p-type or an n-type dopant) or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 102 may be made of silicon or another semiconductor material. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

In some embodiments, the gate structure 109 is formed in a gate-first process. The gate structure 109 includes a gate electrode layer 108 and a gate dielectric layer 107 under the gate electrode layer 108. In some other embodiments, the gate structure 109 is also referred to as a dummy gate structure 109 that is used in a gate-last process. The dummy gate structure 109 includes a dummy gate dielectric layer 107 and a dummy gate electrode layer 108 over the dummy gate dielectric layer 107. The dummy gate structure 109 is replaced with a replacement gate structure 120 (FIG. 1C) in the gate-last process.

In some examples, the dummy gate dielectric layer 107 includes dielectric materials, such as silicon oxide, silicon nitride, silicon oxynitride, or a combination thereof. In some examples, the dummy gate electrode layer 108 is made of polysilicon. The dummy gate dielectric layer 107 and the dummy gate electrode layer 108 are formed independently using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Thereafter, those deposited layers of the dummy gate dielectric layer 107 and the dummy gate electrode layer 108 are patterned into the dummy gate structure 109, for example, using photolithography and one or more etching processes. For example, a photoresist layer can be formed on a mask layer over the dummy gate electrode layer 108. The photoresist layer is formed using spin-on coating, and is patterned by exposing the photoresist layer to light using an appropriate photo mask. Exposed or unexposed portions of the photoresist layer may then be removed depending on whether a positive or negative photoresist is used. The pattern of the photoresist layer may then be transferred to the mask layer, the dummy gate electrode layer 108 and the dummy gate dielectric layer 107, such as by using one or more suitable etching processes. The one or more etching processes may include a reactive ion etch (RIE), neutral beam etch (NBE), or a combination thereof. The etching process may be anisotropic. Subsequently, the photoresist layer is removed in an ashing process or a wet strip process, for example.

Afterwards, gate spacers 110 are formed on the sidewalls of the dummy gate structure 109. The gate spacers 110 may be formed by conformally depositing one or more layers of gate spacer material and anisotropically etching the one or more layers. The one or more layers deposited for the gate spacers 110 are made of silicon oxide, silicon nitride, silicon oxynitride, silicon carbon nitride, multiple layers thereof, or a combination thereof. The one or more layers of the gate spacers 110 may be deposited by CVD, ALD, or another deposition technique. The etching process can include a RIE, NBE or another etching process.

In some embodiments, the source region 106S and the drain region 106D are formed in an active area of the substrate 102 at opposite sides of the dummy gate structure 109 and outside of the gate spacers 110. For example, the source region 106S and the drain region 106D may be formed by implanting dopants into the active area of the substrate 102 using the dummy gate structure 109 and the gate spacers 110 as a mask. Examples of dopants for the source region 106S and the drain region 106D are boron for a p-type device; or phosphorus or arsenic for an n-type device, although other dopants may be used.

In some embodiments, an active area of the substrate 102, for example a fin, is recessed using the dummy gate structure 109 and the gate spacers 110 as a mask, and then epitaxial structures are epitaxially grown in the recesses that are in the fin to form the epitaxial structures of the source region 106S and the drain region 106D at opposite sides of the dummy gate structure 109. The recessing of the fin can be performed with an etching process. The etching process may be isotropic or anisotropic, or it may be selective with respect to one or more crystalline planes of the material of the fin. Hence, the recesses in the fin can have various cross-sectional profiles based on the etching process that is implemented. The etching process may be a dry etch, such as a RIE or NBE; or a wet etch, such as using tetramethylammonium hydroxide (TMAH), ammonium hydroxide (NH$_4$OH), or another etchant.

The epitaxial structures of the source region 106S and the drain region 106D may be made of silicon germanium (SixGe1-x, where x can be between approximately 0 and 1), silicon carbide, silicon phosphorus, silicon carbon phosphorus, pure germanium, a III-V compound semiconductor, a II-VI compound semiconductor, or the like. Examples of the materials used in the III-V compound semiconductor include InAs, AlAs, GaAs, InP, GaN, InGaAs, InAlAs, GaSb, AlSb, AlP, and GaP. The epitaxial structures of the source region 106S and the drain region 106D are formed in the recesses that are in the fin by an epitaxial growth process, such as metal-organic CVD (MOCVD), molecular beam epitaxy (MBE), liquid phase epitaxy (LPE), vapor phase epitaxy (VPE), selective epitaxial growth (SEG), or a combination thereof.

The epitaxial structures of the source region 106S and the drain region 106D may be raised relative to the top surface of the substrate 102 in a planar FET or relative to the top surface of the fin in a FinFET. The epitaxial structures of the source region 106S and the drain region 106D may be doped by in-situ doping during the epitaxial growth and/or by implantation after the epitaxial growth. Examples of dopants for the epitaxial structures of the source region 106S and the drain region 106D (e.g., by in-situ doping or implantation) are boron for a p-type device; or phosphorus or arsenic for an n-type device, although other dopants may be used. The source region 106S and the drain region 106D may have a dopant concentration in a range from about $10^{19}$ cm$^{-3}$ to about $10^{21}$ cm$^{-3}$.

Afterwards, a contact etch stop layer (CESL) 112 is formed on the source region 106S and the drain region 106D, as shown in FIG. 1A in accordance with some embodiments. The contact etch stop layer 112 is also conformally deposited on the top surfaces of the dummy gate structure 109 and the gate spacers 110, and along the sidewalls of the gate spacers 110. Next, an interlayer dielectric (ILD) layer 114 is deposited over the contact etch stop layer 112. Generally, the contact etch stop layer 112 can provide a mechanism to stop an etching process when forming contact holes for the source region 106S and the drain region 106D. The contact etch stop layer 112 can be formed of a dielectric material that has an etch selectivity different from adjacent layers, for example, the ILD layer 114. The contact etch stop layer 112 may be made of silicon nitride, silicon carbon nitride, silicon carbon oxide, or a combination thereof, and may be deposited by CVD, PECVD, ALD, or another deposition technique.

The ILD layer 114 may be made of silicon dioxide, silicon oxynitride, a low-k dielectric material (e.g., a material having a dielectric constant (k value) lower than k value (about 3.9) of silicon dioxide), such as phosphosilicate glass (PSG), borosilicate glass (BSG), borophosphosilicate glass (BPSG), undoped silicate glass (USG), fluorinated silicate glass (FSG), organosilicate glasses (OSG), SiOxCy, spin-on-glass (SOG), spin-on-polymers, silicon carbon material, or a combination thereof. The ILD layer 114 may be deposited by spin-on coating, CVD, flowable CVD (FCVD), PECVD, PVD, or another deposition technique.

Thereafter, a planarization process, for example a chemical mechanical polishing (CMP) process, is performed on the contact etch stop layer 112 and the ILD layer 114. After the CMP process, the top surfaces of the dummy gate structure 109 and the gate spacers 110 are coplanar with the top surfaces of the contact etch stop layer 112 and the ILD layer 114. The dummy gate structure 109 and the gate spacers 110 are thereby exposed.

Figure 1B:
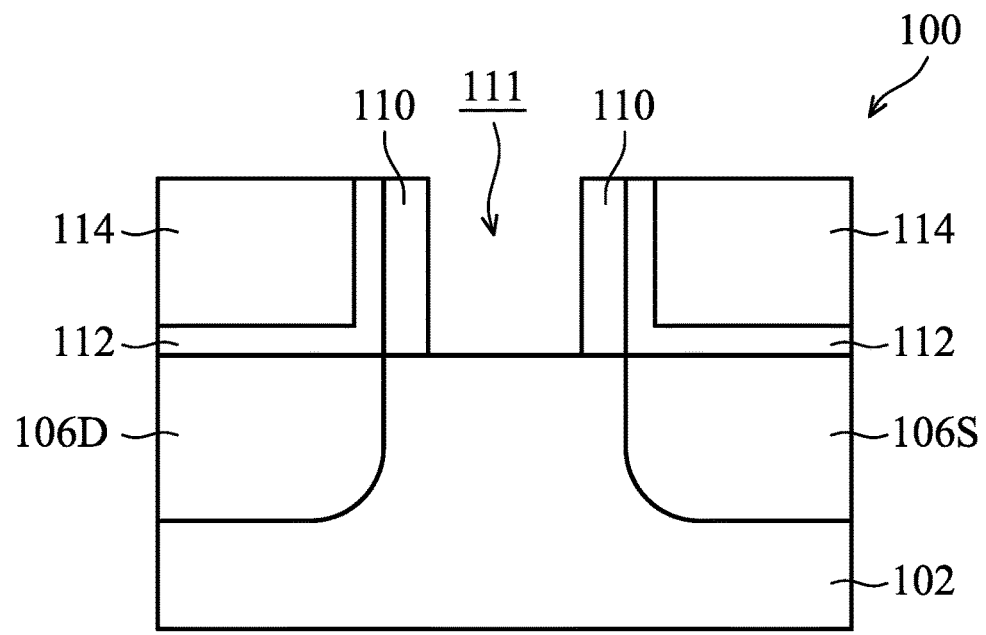

Next, the dummy gate structure 109 is removed to form a recess 111 between the gate spacers 110, as shown in FIG. 1B in accordance with some embodiments. The dummy gate electrode layer 108 and the dummy gate dielectric layer 107 are removed, such as by one or more etching processes. The dummy gate electrode layer 108 may be removed by an etching process selective to the material of the dummy gate electrode layer 108, wherein the dummy gate dielectric layer 107 can act as an etch stop layer. Then, in some examples, the dummy gate dielectric layer 107 can be removed by a different etching process selective to the material of the dummy gate dielectric layer 107. The etching processes can be, for example, RIE, NBE, wet etching, or another etching process. In some examples, the dummy gate dielectric layer 107 may remain in the recess 111 to be used as an interfacial layer for a replacement gate structure. In some other examples, an interfacial layer is formed by thermal or chemical oxidation on the bottom surface of the recess 111. The interfacial layer may be formed in various processing steps. For example, the interfacial layer may be a native oxide formed as a result of a cleaning process. In other examples, the interfacial layer may be omitted.

Figure 1C:
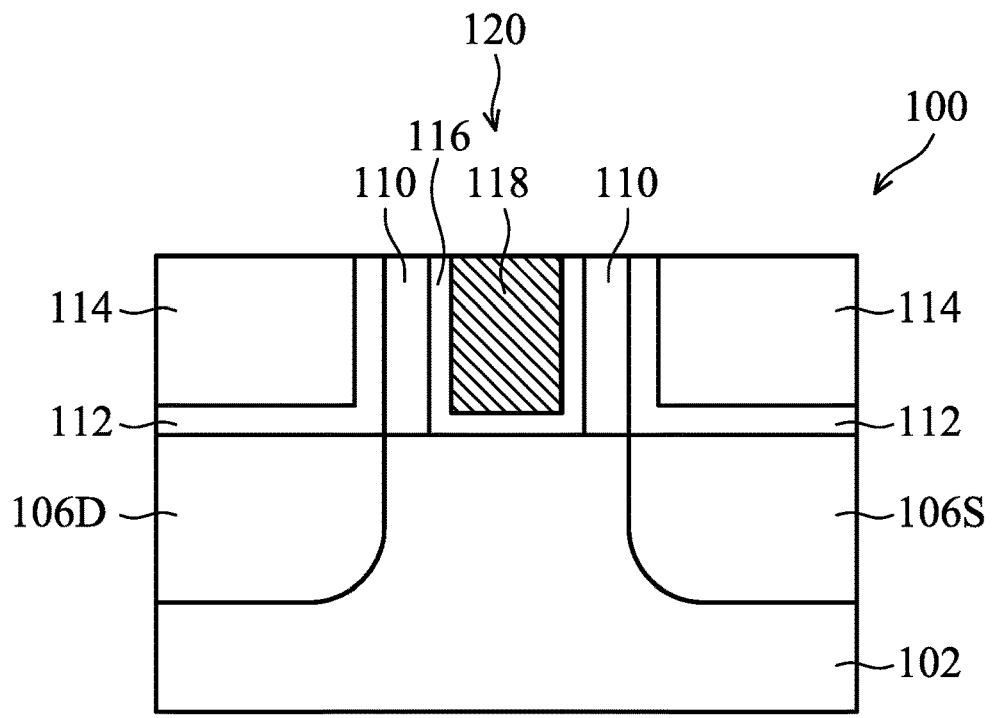

Afterwards, a gate structure 120 is formed in the recess 111 where the dummy gate structure 109 is removed, as shown in FIG. 1C in accordance with some embodiments. The gate structure 120 is also referred to as a replacement or real gate structure. The gate structure 120 includes a high dielectric constant (high-k) gate dielectric layer 116 and a metal gate electrode layer 118 over the high-k gate dielectric layer 116. The high-k gate dielectric layer 116 is conformally deposited in the recess 111 (FIG. 1B), along the sidewalls and the bottom of the recess 111. The high-k gate dielectric layer 116 is also deposited on the inner sidewalls of the gate spacers 110, and over the top surfaces of the gate spacers 110, the contact etch stop layer 112 and the ILD layer 114.

The material of the high-k gate dielectric layer 116 may be a high-k dielectric material having a k-value greater than about 7.0. The high-k dielectric material includes a metal oxide or a metal silicate of Hf, Al, Zr, La, Mg, Ba, Ti, Pb, or a combination thereof. The high-k gate dielectric layer 116 may be deposited by ALD, PECVD, Molecular-Beam Deposition (MBD), or another deposition technique. In some examples, the high-k gate dielectric layer 116 has a thickness that is in a range from about 5 Å to about 25 Å.

The metal gate electrode layer 118 includes multiple layers, such as a barrier layer, a work-function tuning layer, a metal fill material or a combination thereof. The barrier layer and the work-function tuning layer are conformally deposited over the high-k gate dielectric layer 116 in sequence. The material of the barrier layer may include tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof, and may be deposited by ALD, PECVD, MBD, or another deposition process. In some examples, the barrier layer has a thickness that is in a range from about 5 Å to about 25 Å.

The material of the work-function tuning layer may include titanium aluminum carbide (TiAlC), titanium aluminum alloy (TiAl), tantalum-aluminum carbide, or a combination thereof, and may be deposited by ALD, PECVD, MBD, or another deposition process. In some examples, the work-function tuning layer has a thickness that is in a range from about 10 Å to about 60 Å. Other examples may have various other configurations of work-function tuning layers to achieve a desired performance of the semiconductor device 100 to be formed. For example, any different number of work-function tuning layers having various materials and/or thicknesses may be used. In some instances, for example, a p-type FET and an n-type FET may have different work-function tuning layers. The metal fill material is deposited to fill the remaining space of the recess 111 over the work-function tuning layer. The metal fill material may include tungsten, cobalt, ruthenium, aluminum, copper, multi-layers thereof, or a combination thereof. The metal fill material may be deposited by ALD, PECVD, MBD, PVD, or another deposition process.

In addition, excess portions of the high-k gate dielectric layer 116 and the metal gate electrode layer 118 deposited over the top surfaces of the contact etch stop layer 112, the ILD layer 114 and the gate spacers 110 may be removed in a planarization process, such as a CMP process. The result of the planarization process is illustrated as the structure of FIG. 1C in accordance with some embodiments. The top surface of the gate structure 120 is coplanar with the top surfaces of the contact etch stop layer 112, the ILD layer 114 and the gate spacers 110.

Figure 1D:
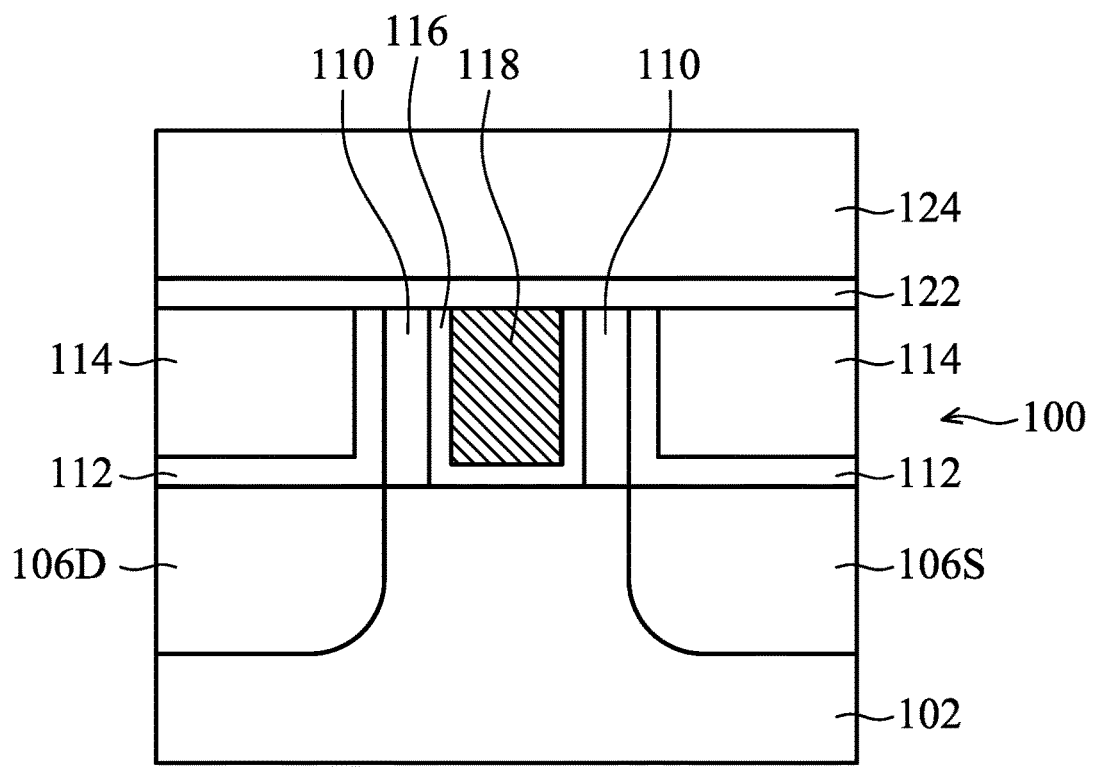

Afterwards, an etch stop layer 122 is deposited on the semiconductor device 100, and then an ILD layer 124 is deposited on the etch stop layer 122, as shown in FIG. 1D in accordance with some embodiments. The etch stop layer 122 is made of a different material than the ILD layer 124. In some examples, the material of the etch stop layer 122 includes silicon nitride, silicon oxynitride, silicon carbon nitride, silicon carbon oxide, or a combination thereof, and may be deposited by CVD, PECVD, ALD, or another deposition technique. The material of the etch stop layer 122 may be the same as or similar to the material of the contact etch stop layer 112.

In some examples, the ILD layer 124 includes silicon dioxide, a low-k dielectric material (e.g., a material has a k-value lower than about 3.9), for example PSG, BSG, BPSG, USG, FSG, OSG, silicon oxycarbide (SiOxCy), SOG, spin-on-polymers, silicon carbon material, or a combination thereof. The material of the ILD layer 124 may be the same as or similar to the material of the ILD layer 114. The ILD layer 124 may be deposited by spin-on coating, CVD, Flowable CVD (FCVD), PECVD, PVD, or another deposition technique.

Figure 1E:
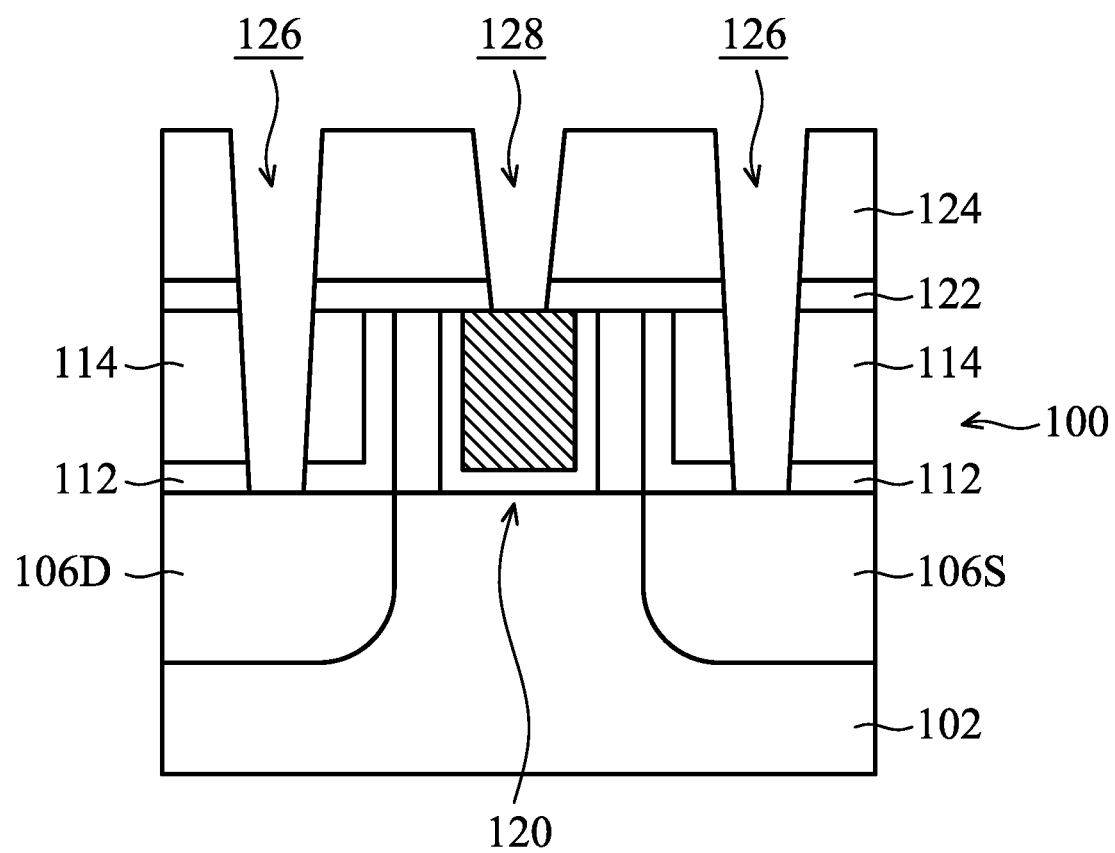

Next, contact holes 126 for the source region 106S and the drain region 106D are formed in the ILD layer 124 and the ILD layer 114, as shown in FIG. 1E in accordance with some embodiments. Moreover, a contact hole 128 for the gate structure 120 is formed in the ILD layer 124 and passes through the etch stop layer 122. The gate structure 120 is exposed through the contact hole 128. The contact holes 126 are also formed to pass through the etch stop layer 122 and the contact etch stop layer 112. The source region 106S and the drain region 106D are exposed through the contact holes 126, respectively.

The contact holes 126 and 128 are formed using photolithography and etching processes. In some embodiments, a patterned photoresist layer is formed on the ILD layer 124. The patterned photoresist layer has multiple openings that correspond to the locations of the contact holes 126 and 128. The contact holes 126 and 128 are formed in an etching process using the patterned photoresist layer as an etch mask. The etching process includes a dry etching process, a wet etching process, another suitable etching process, or a combination thereof. After the etching process, the patterned photoresist layer is removed from ILD layer 124, for example, by a stripping process.

Figure 1F:
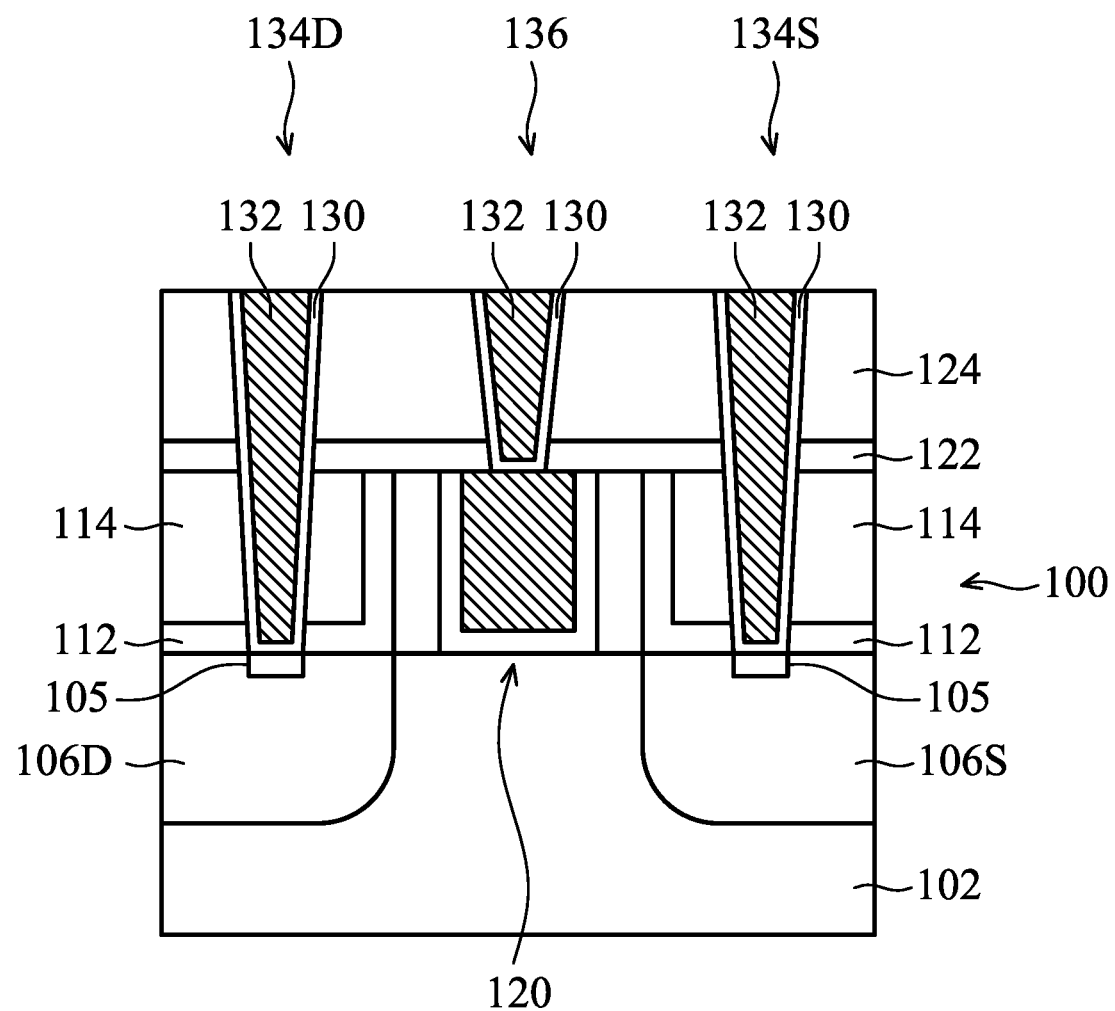

Next, a liner 130 is formed in the contact holes 126 and 128, as shown in FIG. 1F in accordance with some embodiments. The liner 130 is conformally deposited on the sidewalls and on the bottoms of the contact holes 126 and 128. The liner 130 may be used as a diffusion barrier layer, an adhesion layer, or a combination thereof. The liner 130 may include titanium, titanium nitride, tantalum, tantalum nitride, or a combination thereof, and may be deposited by ALD, PECVD, MBD, PVD, or another deposition technique. Moreover, an anneal process may be performed to facilitate a reaction between bottom portions of the liner 130 and the source region 106S and the drain region 106D to form respective silicide regions 105 on the source region 106S and the drain region 106D.

Afterwards, a conductive material 132 is formed over the liner 130 to fill the contact holes 126 and 128, as shown in FIG. 1F in accordance with some embodiments. The conductive material 132 includes a metal, such as cobalt, tungsten, copper, aluminum, gold, silver, alloys thereof, or a combination thereof. The conductive material 132 may be deposited by CVD, ALD, PVD, or another deposition technique. The material layers of the liner 130 and the conductive material 132 are also deposited on the ILD layer 124. A planarization process, such as a CMP process, may be performed to remove excess portions of the liner 130 and the conductive material 132 from the top surface of the ILD layer 124. As a result, a source contact 134S, a drain contact 134D and a gate contact 136 are formed, as shown in FIG. 1F in accordance with some embodiments. After the CMP process, the top surfaces of the source contact 134S, the drain contact 134D and the gate contact 136 may be coplanar with the top surface of the ILD layer 124. Each of the source contact 134S, the drain contact 134D and the gate contact 136 includes the liner 130 and the conductive material 132 over the liner 130. The silicide regions 105 can reduce the contact resistance between the source region 106S and the source contact 134S, and reduce the contact resistance between the drain region 106D and the drain contact 134D.

Figure 1G:
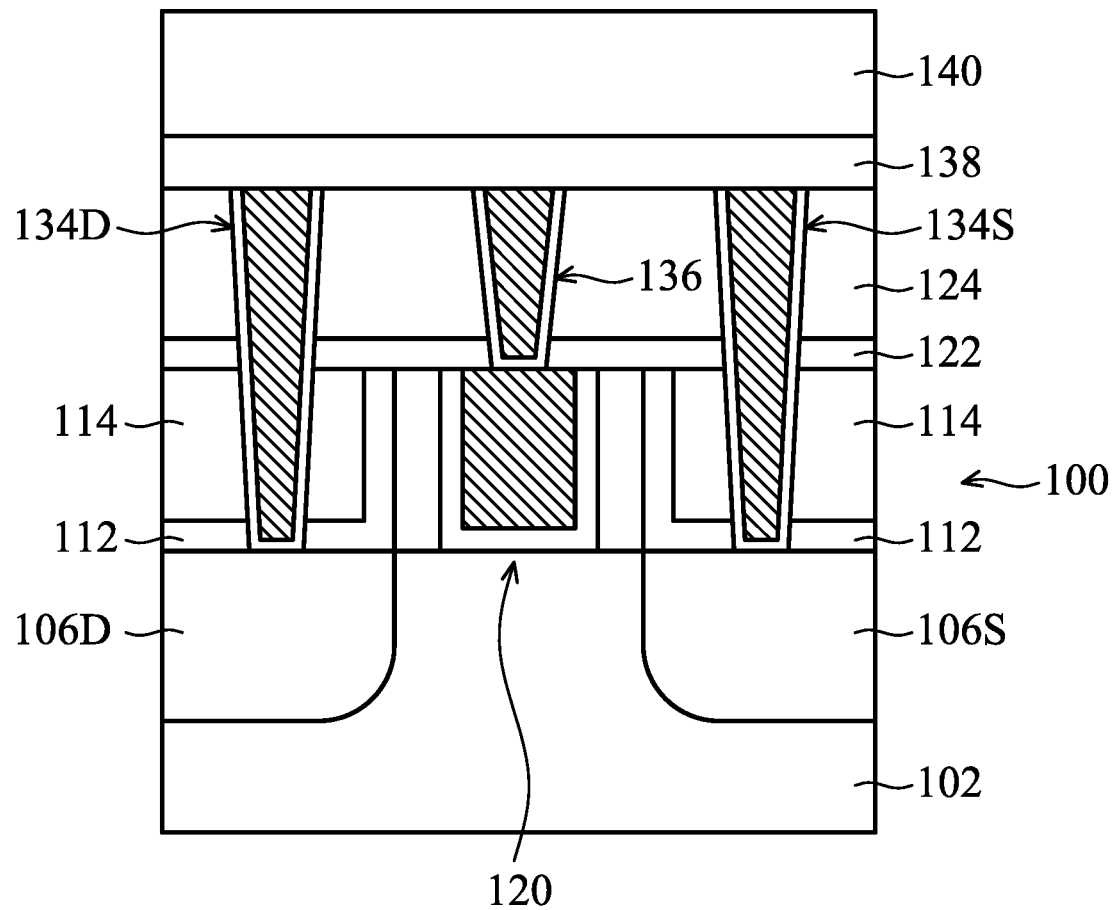

Next, an etch stop layer 138 is deposited on the ILD layer 124, the source contact 134S, the drain contact 134D and the gate contact 136, as shown in FIG. 1G in accordance with some embodiments. In addition, an ILD layer 140 is deposited on the etch stop layer 138. The etch stop layer 138 is made of a different material than the ILD layer 124 and the ILD layer 140. In some examples, the material of the etch stop layer 138 includes silicon nitride, silicon oxynitride, silicon carbon nitride, silicon carbon oxide, or a combination thereof, and may be deposited by CVD, PECVD, ALD, or another deposition technique. The material of the etch stop layer 138 may be the same as or similar to the material of the etch stop layer 122.

In some examples, the ILD layer 140 includes silicon dioxide, a low-k dielectric material (e.g., a material having a k-value lower than about 3.9), for example PSG, BSG, BPSG, USG, FSG, OSG, silicon oxycarbide (SiOxCy), SOG, spin-on-polymers, silicon carbon material, or a combination thereof. The material of the ILD layer 140 may be the same as or similar to the material of the ILD layer 124. The ILD layer 124 may be deposited by spin-on coating, CVD, Flowable CVD (FCVD), PECVD, PVD, or another deposition technique.

Figure 1H:
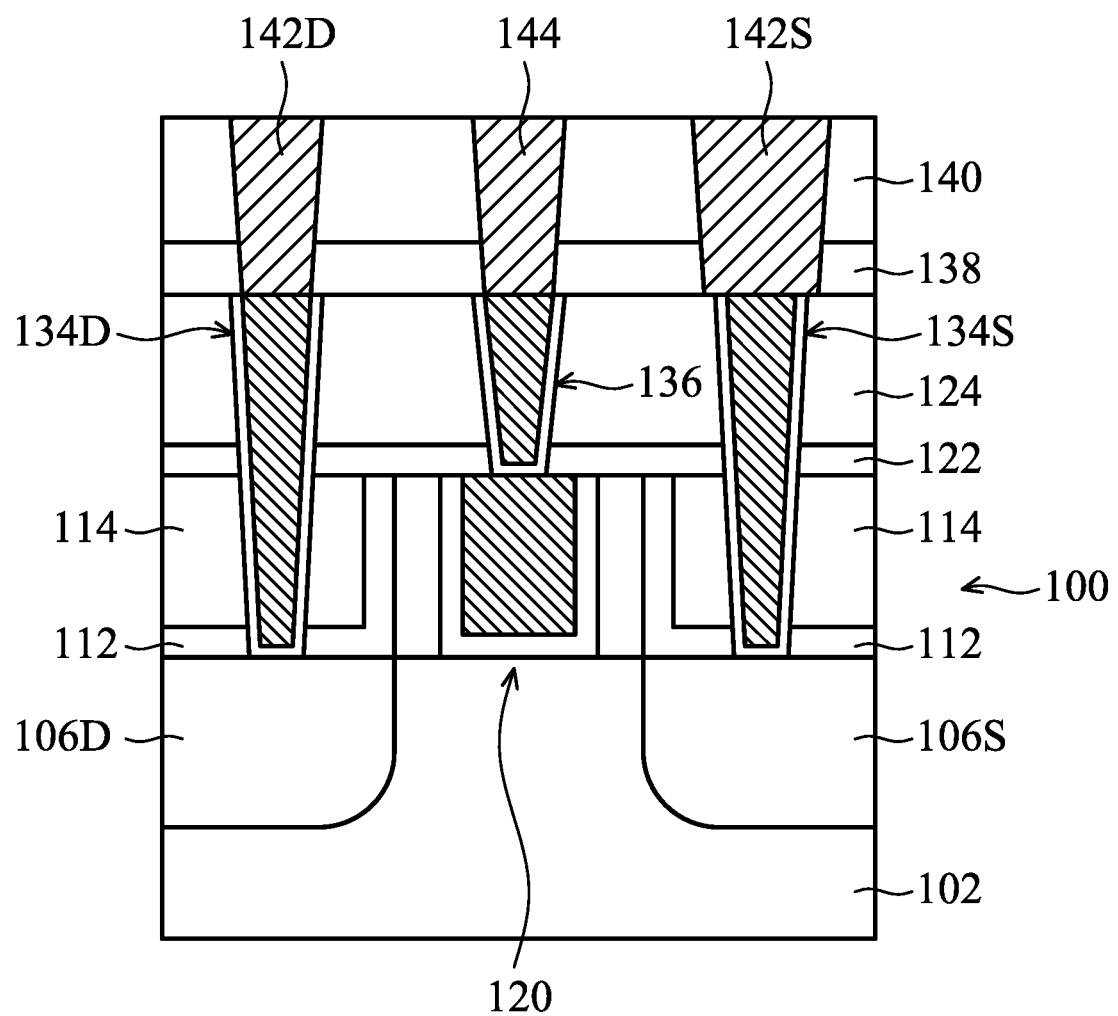

Afterwards, a via contact 142S, a via contact 142D and a via contact 144 are formed in the ILD layer 140 and pass through the etch stop layer 138, as shown in FIG. 1H in accordance with some embodiments. The via contact 142S is electrically connected to the source contact 134S. The via contact 142D is electrically connected to the drain contact 134D. The via contact 144 is electrically connected to the gate contact 136. The via contacts 142S, 142D and 144 are formed by forming openings in the ILD layer 140 and pass through the etch stop layer 138 using an etching process. The etching process includes a dry etching process, a wet etching process, another suitable etching process, or a combination thereof, and uses a patterned photoresist layer as an etch mask. The patterned photoresist layer has multiple openings that correspond with the locations of the via contacts 142S, 142D and 144.

Next, the openings in the ILD layer 140 and the etch stop layer 138 are filled with a conductive material using a deposition process. The excess portions of the conductive material deposited on the ILD layer 140 are removed by a planarization process, such as a CMP process. Thereafter, the via contacts 142S, 142D and 144 are formed to be coplanar with the ILD layer 140. In some examples, the conductive material of the via contacts 142S, 142D and 144 includes Ta, Ti, Al, Cu, Co, TaN, TiN, TaN, alloy thereof, or a combination thereof. The conductive material can be deposited by PVD, CVD, ALD, electroplating, electro-less plating, another suitable deposition process, or a combination thereof.

Figure 1I:
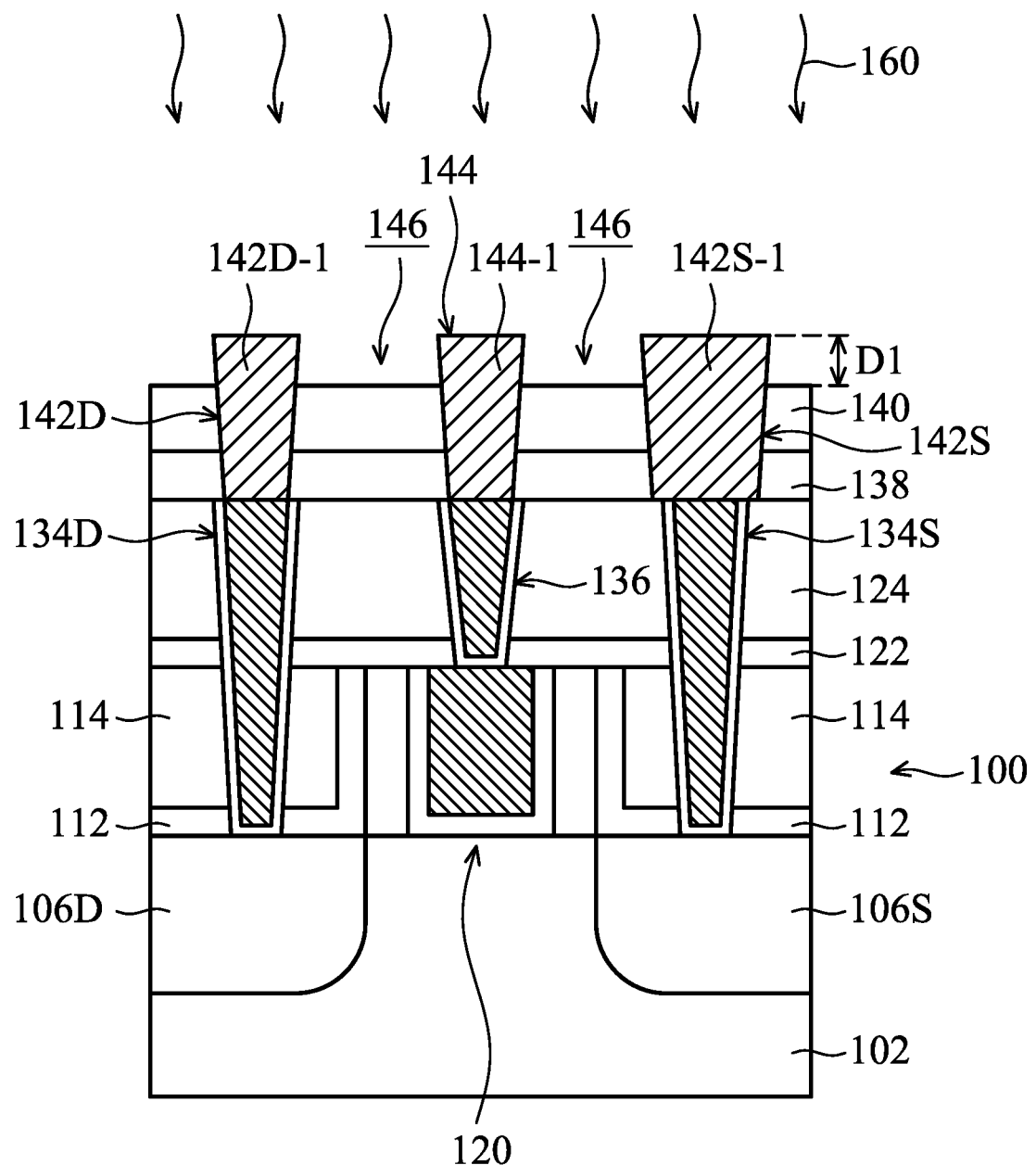

Afterwards, the ILD layer 140 is etched back using an etching process 160 to form recesses 146 between the via contacts 142S, 142D and 144, as shown in FIG. 1I in accordance with some embodiments. In some examples, the recesses 146 have a depth D1 that is in a range from greater than 0 nm to about 50 nm, for example in a range from about 0.1 nm to about 50 nm. After the ILD layer 140 is etched back, an upper portion 142S-1 of the via contact 142S, an upper portion 142D-1 of the via contact 142D, and an upper portion 144-1 of the via contact 144 are exposed. The via contacts 142S, 142D and 144 are partially in the ILD layer 140. The upper portion 142S-1 of the via contact 142S, the upper portion 142D-1 of the via contact 142D, and the upper portion 144-1 of the via contact 144 protrude from the ILD layer 140. The via contact 142S, the via contact 142D and the via contact 144 are thereby raised relative to the ILD layer 140, as illustrated in FIG. 1I in accordance with some embodiments.

Each of the upper portion 142S-1 of the via contact 142S, the upper portion 142D-1 of the via contact 142D, and the upper portion 144-1 of the via contact 144 has the shape of an inverted trapezoid. According to the embodiments of the disclosure, the via contact 142S, the via contact 142D and the via contact 144 have a raised profile relative to the ILD layer 140 in a cross section, and may be referred to as sawtooth via contacts. The etching process 160 may be anisotropic and is selective to the material of the ILD layer 140. In some embodiments, the etching process 160 may be a dry etching process such as atomic layer etch (ALE), reactive ion etch (RIE), neutral beam etch (NBE), or a combination thereof. The dry etching process may be performed with fluorine-based plasma and uses etch gases, such as $C_4F_8$, $C_4F_6$, $CF_4$, $CHF_3$, $CH_2F_2$, $CH_3F$ or a combination thereof. In some embodiments, the etching process 160 may be a wet etching process using a fluoride-based aqueous etch solution, for example diluted hydrofluoric acid (dHF).

Figure 1J:
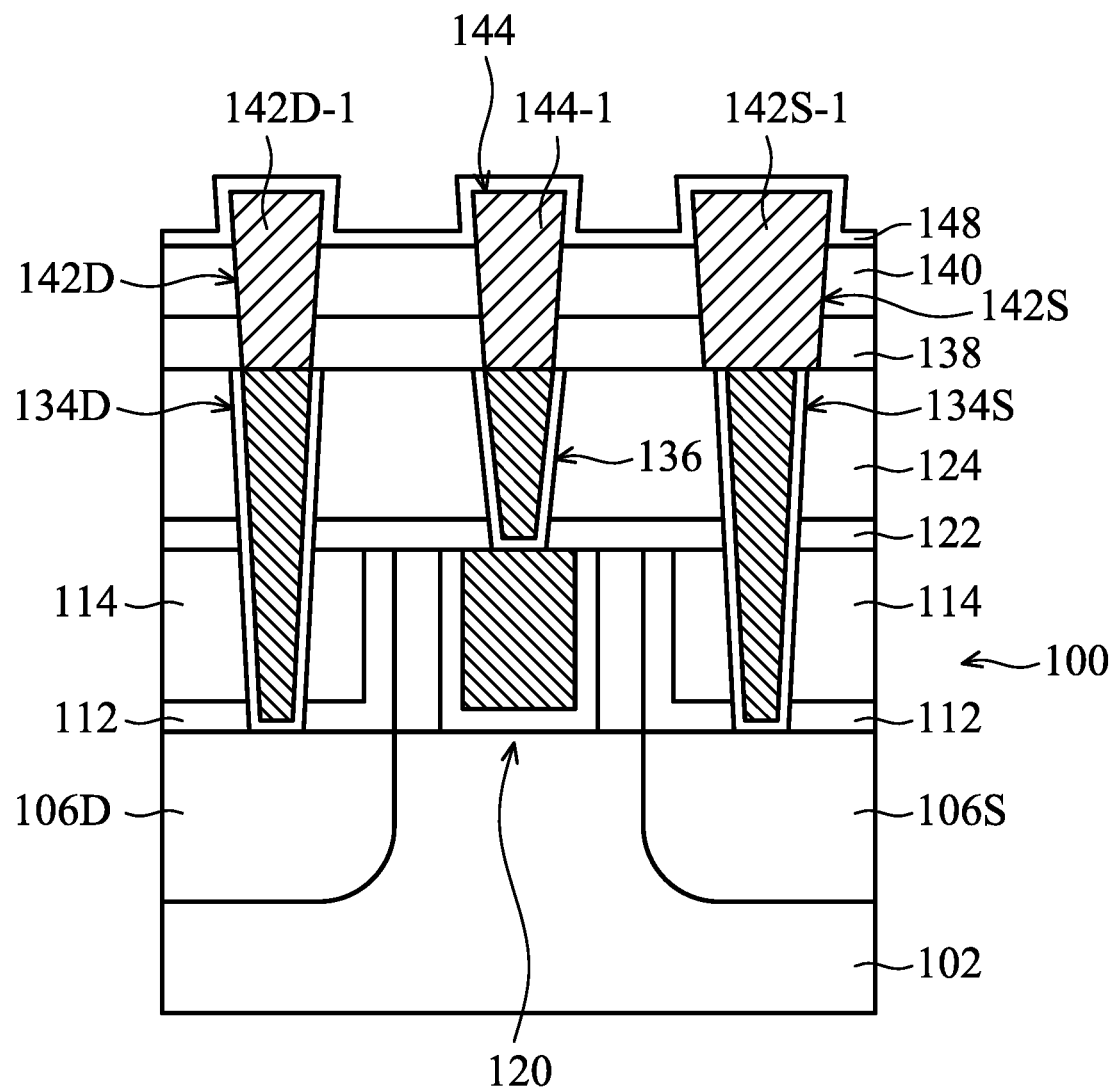

Next, an etch stop layer 148 is formed on the ILD layer 140, the via contacts 142S, 142D and 144, as shown in FIG. 1J in accordance with some embodiments. The etch stop layer 148 is conformally deposited on the top surfaces and along the sidewalls of the upper portion 142S-1 of the via contact 142S, the upper portion 142D-1 of the via contact 142D, and the upper portion 144-1 of the via contact 144. The etch stop layer 148 has some portions that are raised relative to the ILD layer 140. The etch stop layer 148 may be a single-layered or multiple-layered dielectric layer. In some examples, the etch stop layer 148 has a thickness that is in a range from about 0.1 nm to about 20 nm.

In addition, the material of the etch stop layer 148 is different from the material of the ILD layer 140. The etch stop layer 148 has an etch selectivity to the ILD layer 140. In some examples, the etch selectivity is in a range from greater than about 1 to about 100. In some embodiments, the etch stop layer 148 is made of a high-k dielectric material that has a k-value greater than about 5. The material of the etch stop layer 148 may be a nitrogen-containing oxide, a metal oxide, or a combination thereof. The metal oxide is for example aluminum (Al)-containing oxide, hafnium (Hf)-containing oxide, tantalum (Ta)-containing oxide, titanium (Ti)-containing oxide, zirconium (Zr)-containing oxide, lanthanum (La)-containing oxide, or a combination thereof. In some embodiments, the etch stop layer 148 is made of SiON, $Ta_2O_5$, $Al_2O_3$, or a combination thereof. The etch stop layer 148 may be deposited by CVD, PECVD, ALD, or another deposition technique.

Figure 1K:
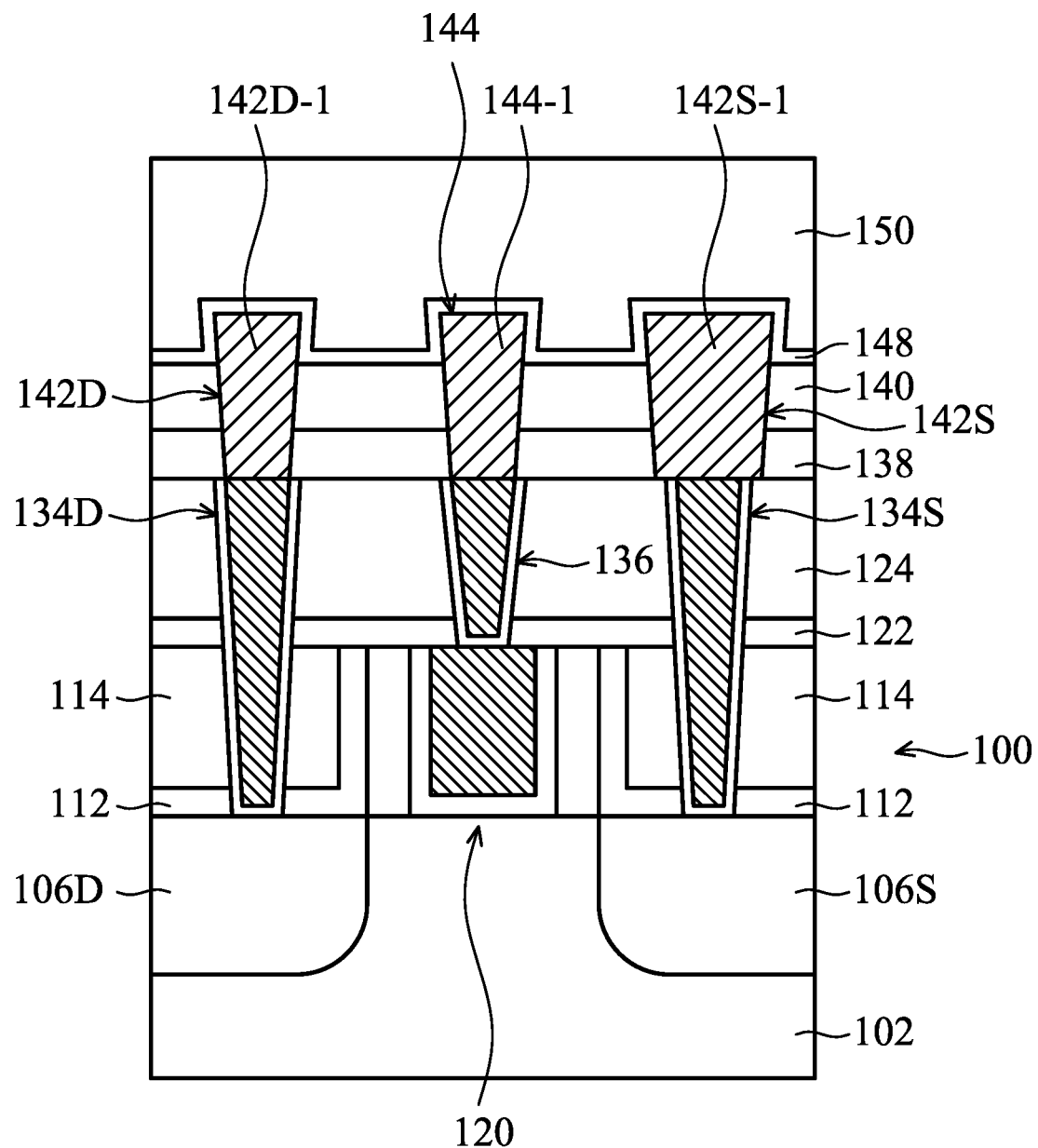

Next, an inter-metal dielectric (IMD) layer 150 is deposited on the etch stop layer 148, as shown in FIG. 1K in accordance with some embodiments. The material of the etch stop layer 148 is different from the material of the IMD layer 150. The material of the IMD layer 150 is for example, silicon oxide, silicon nitride, tetraethoxysilane (TEOS) formed oxide, PSG, BPSG, a low-k dielectric material, another suitable dielectric material, or a combination thereof. The low-k dielectric material is for example FSG, carbon doped silicon oxide, Black Diamond® (Applied Materials of Santa Clara, California), Xerogel, Aerogel, amorphous fluorinated carbon, parylene, benzocyclobutene (BCB), SiLK (Dow Chemical, Midland, Michigan), polyimide, or a combination thereof. The IMD layer 150 may be deposited by spin-on coating, CVD, Flowable CVD (FCVD), PECVD, PVD, or another deposition technique. The etching rate of the etch stop layer 148 is similar to that of the IMD layer 150.

Figure 1L:
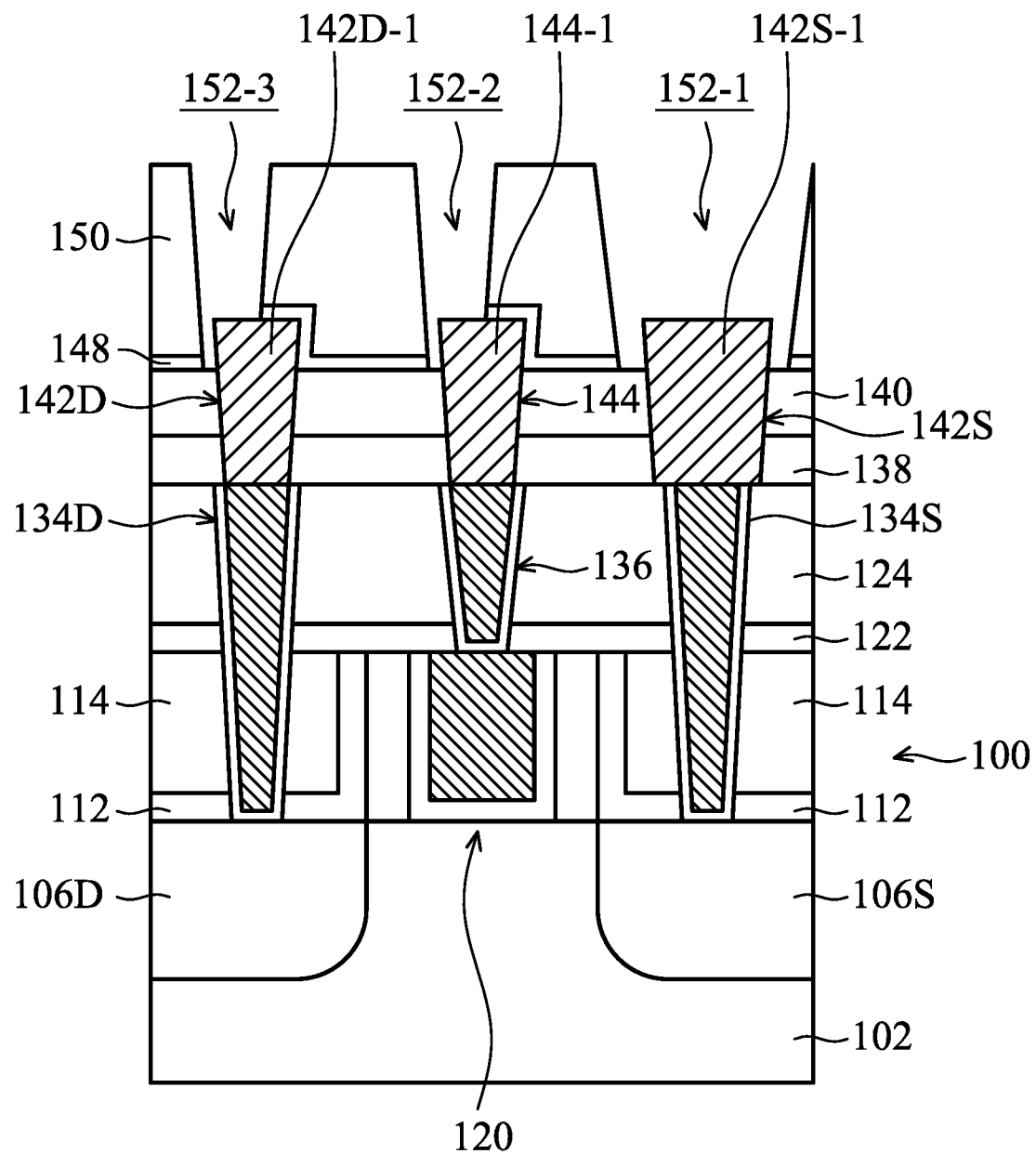

Afterwards, the IMD layer 150 is patterned to form multiple openings 152-1, 152-2 and 152-3, as shown in FIG. 1L in accordance with some embodiments. The openings 152-1, 152-2 and 152-3 are formed to pass through the etch stop layer 148. The via contacts 142S, 142D and 144 are exposed through the openings 152-1, 152-2 and 152-3, respectively. In some embodiments, the entire top surface and the entire sidewalls of the upper portion 142S-1 of the via contact 142S are exposed through the opening 152-1. A partial top surface and an adjacent sidewall of the upper portion 144-1 of the via contact 144 are exposed through the openings 152-2. A partial top surface and an adjacent sidewall of the upper portion 142D-1 of the via contact 142D are exposed through the opening 152-3. In some embodiments, the width of the opening 152-1 is larger than that of the openings 152-2 and 152-3. Moreover, the width of the via contact 142S is larger than that of the via contacts 144 and 142D.

Figure 1M:
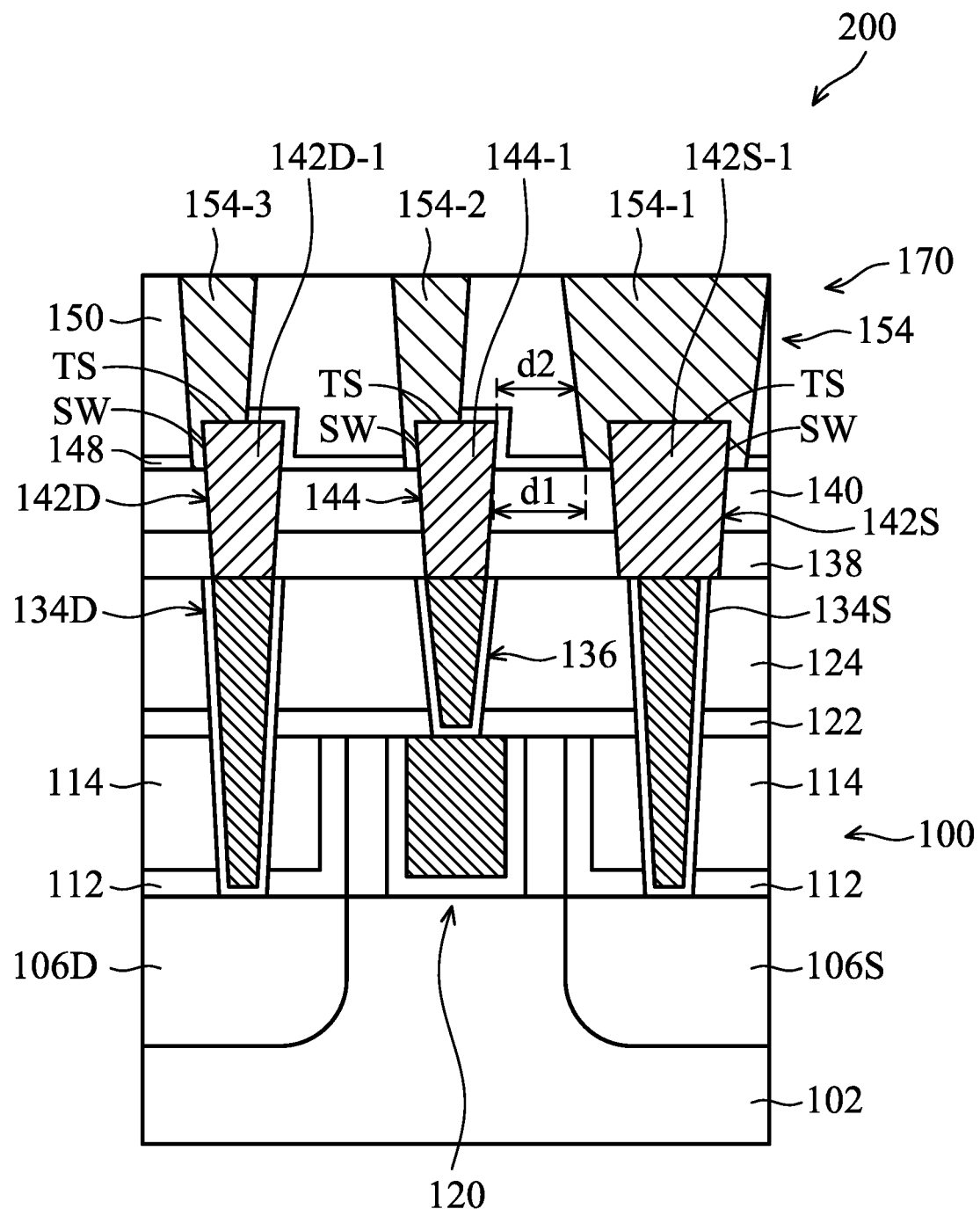

The IMD layer 150 may be patterned using photolithography and etching processes to form the openings 152-1, 152-2 and 152-3. A patterned photoresist layer is formed on the IMD layer 150 using a photolithography process. The patterned photoresist layer is used as an etch mask in an etching process for forming the openings 152-1, 152-2 and 152-3. The etching process includes a dry etching process, a wet etching process, another suitable etching process, or a combination thereof Thereafter, openings 152-1, 152-2 and 152-3 are filled with a metal-containing material to form metal lines 154-1, 154-2 and 154-3, respectively, as shown in FIG. 1M in accordance with some embodiments. The metal lines 154-1, 154-2 and 154-3 are in the same level metal layer, for example a metal layer (M0) 154 of an interconnect structure 170. The interconnect structure 170 further includes multiple-level metal layers, multiple-level dielectric layers, and multiple-level vias formed above the metal layer (M0) 154. In the interconnect structure 170, a dielectric layer is disposed between two metal layers. The vias are disposed in the dielectric layer and provide an electrical connection between the two metal layers. The interconnect structure 170 is disposed on the semiconductor device 100 to complete an integrated circuit device 200.

In some examples, the metal-containing material for forming the metal lines 154-1, 154-2 and 154-3 includes any suitable conductive material, such as Ta, Ti, Al, Cu, Co, TaN, TiN, TaN, an alloy thereof, or a combination thereof. The metal-containing material may be deposited on the IMD layer 150 and fills the openings 152-1, 152-2 and 152-3 by PVD, CVD, ALD, electroplating, electroless plating, another suitable deposition process, or a combination thereof. Thereafter, excess portions of the metal-containing material deposited on the IMD layer 150 are removed by a planarization process, such as a CMP process. As a result, the metal lines 154-1, 154-2 and 154-3 are coplanar with the IMD layer 150.

According to some embodiments of the disclosure, the via contact 142S has an upper portion 142S-1 that is raised relative to the ILD layer 140. The metal line 154-1 is in contact with the top surface TS and the sidewalls SW of the upper portion 142S-1 of the via contact 142S. Also, the via contact 144 has the upper portion 144-1 that is raised relative to the ILD layer 140. The raised upper portion 144-1 has an inverted trapezoid cross-section. The metal line 154-2 is in contact with a partial top surface TS and a sidewall SW of the upper portion 144-1 of the via contact 144. Also, the metal line 154-3 is in contact with a partial top surface TS and a sidewall SW of the upper portion 142D-1 of the via contact 142D.

In some embodiments, a distance d1 between the upper portion 144-1 and the metal line 154-1 along the top surface of the ILD layer 140 is longer than a distance d2 between the upper portion 144-1 and the metal line 154-1 along the plane of the top surface of the upper portion 144-1. When a via contact is entirely embedded in an ILD layer, a distance between the via contact and a metal line along the top surface of the ILD layer is less than the distance d1. Therefore, according to the embodiments of the disclosure, the raised via contacts can increase the distance between the via contact 144 and the metal line 154-1 along the top surface of the ILD layer 140. The space between the via contact 144 and the metal line 154-1 is thereby enlarged. The isolation between the via contact 144 and the metal line 154-1 on the adjacent via contact 142S is improved. The improved isolation can avoid a bridge between the via contact 144 and the metal line 154-1. A short circuit is thereby prevented from occurring in the integrated circuit device 200.

Moreover, according to the embodiments of the disclosure, each of the raised via contacts 142S, 144 and 142D provides a top surface TS and a sidewall SW to be in contact with the respective metal lines 154-1, 154-2 and 154-3. Therefore, the contact area between the via contact 142S and the metal line 154-1 is increased compared to the via contact that is entirely embedded in the ILD layer 140. In addition, the contact area between the via contact 144 and the metal line 154-2 is increased. The contact area between the via contact 142D and the metal line 154-3 is also increased. Therefore, according to the embodiments of the disclosure, the raised via contacts 142S, 144 and 142D can reduce a contact resistance (Rc) between a via contact and a metal line directly on the via contact. The performance of the integrated circuit device 200 is thereby enhanced.

In some embodiments, the via contact 142S is electrically coupled to the source region 106S of the semiconductor device 100 and has a width that is greater than the widths of the via contacts 144 and 142D. In the integrated circuit device 200, the via contact 144 is electrically coupled to the gate structure 120, and the via contact 142D is electrically coupled to the drain region 106D of the semiconductor device 100. In addition, the metal line 154-1 that is in contact with the via contact 142S also has a larger width than the widths of the metal lines 154-2 and 154-3. In the integrated circuit device 200, the metal line 154-2 is in contact with the via contact 144, and the metal line 154-3 is in contact with the via contact 142D. The larger widths of the metal line 154-1 and the via contact 142S are for a high current provided in the source region 106S.

According to the embodiments of the disclosure, the raised via contacts can increase the space between a via contact and an adjacent metal line, for example the via contact 144 and the adjacent metal line 154-1. When the metal line coupled to the source region has a large width and the space between a via contact and the metal line becomes smaller as the technology nodes of integrated circuits are developed towards sub-20 nm, the process window of fabricating metal lines on via contacts shrinks. According to the embodiments of the disclosure, the raised via contacts can enlarge the alignment tolerance in a photolithography process and enlarge the process window of fabricating metal lines on via contacts. Therefore, the embodiments of the disclosure can avoid a bridge between a via contact and an adjacent metal line, and avoid a short circuit in the integrated circuit devices.

FIGS. 2A-2F show cross-sectional views of intermediate structures at various stages of an exemplary method for fabricating an integrated circuit device 200, in accordance with some embodiments. The integrated circuit device 200 may include a microprocessor, a memory, and/or other integrated circuit device. The integrated circuit device 200 may be a portion of an IC chip or a system on chip (SoC). The integrated circuit device 200 includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, another suitable component, or a combination thereof. The transistors may be planar transistors or multi-gate transistors, such as FinFETs. FIGS. 2A-2F have been simplified for the sake of clarity to better understand the inventive concepts of the present disclosure. Additional features can be added in the integrated circuit device 200, and some of the features described below can be replaced, modified, or eliminated in other embodiments of the integrated circuit device 200.

Figure 2A:
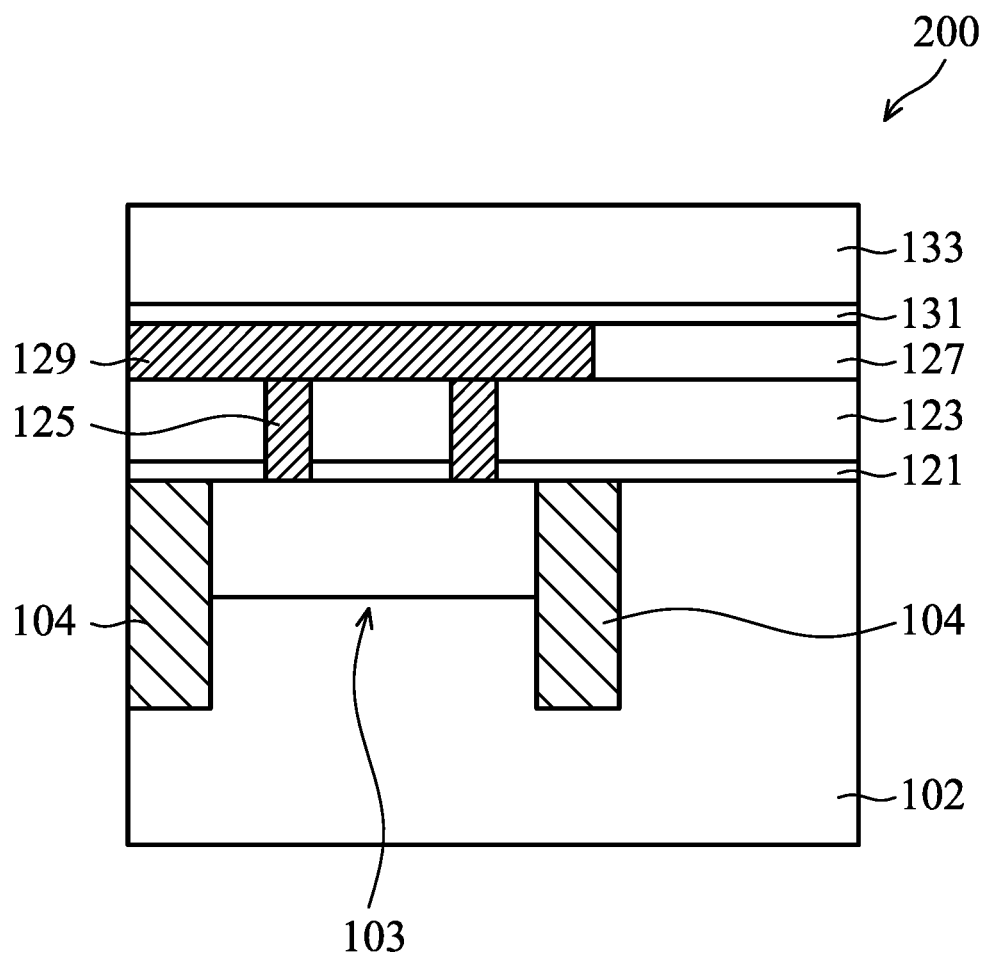
FIGS. 2A-2F show cross-sectional views of intermediate structures at various stages of an exemplary method for fabricating an integrated circuit device having raised vias for an interconnect structure, in accordance with some embodiments.

A substrate 102 is provided, and an active region 103 is formed in the substrate 102 and is surrounded by an isolation structure 104, as shown in FIG. 2A in accordance with some embodiments. The materials of the substrate 102 may be the same as or similar to those described above with respect to the substrate 102 of FIG. 1A. The isolation structure 104 defines and electrically isolates the active region 103 from another active region. The isolation structure 104 is for example a shallow trench isolation (STI) structure, a deep trench isolation (DTI) structure, or a local oxidation of silicon (LOCOS) structure. The material of the isolation structure 104 includes silicon oxide, silicon nitride, silicon oxynitride, another suitable isolation material, or a combination thereof. The active region 103 may include various transistors as those described above, and not repeated again.

A contact etch stop layer (CESL) 121 is formed over the active region 103, the isolation structure 104 and the substrate 102. An interlayer dielectric (ILD) layer 123 is formed on the contact etch stop layer (CESL) 121. Multiple via contacts 125 are formed in the ILD layer 123 and pass through the CESL 121 to electrically connect to the active region 103. The materials of the CESL 121 and the ILD layer 123 may be the same as or similar to those described above with respect to the CESL 112 and the ILD layer 114 of FIG. 1A. In addition, the material and process of forming the via contacts 125 may be the same as or similar to those described above with respect to the contacts 134S, 134D and 136 of FIG. 1F, or the via contacts 142S, 142D and 144 of FIG. 1I.

An inter-metal dielectric (IMD) layer 127 is deposited on the ILD layer 123, and a first metal layer (M1) 129 is formed in the IMD layer 127, as shown in FIG. 2A in accordance with some embodiments. The first metal layer 129 is electrically coupled to the via contacts 125. The materials and processes of forming the IMD layer 127 and the first metal layer 129 may be the same as or similar to those described above with respect to the IMD layer 150 of FIG. 1K and the metal layer (M0) 154 of FIG. 1M.

Next, an etch stop layer 131 is deposited on the IMD layer 127 and the first metal layer 129, and then an ILD layer 133 is deposited on the etch stop layer 131, as shown in FIG. 2A in accordance with some embodiments. The materials and processes of forming the etch stop layer 131 and the ILD layer 133 may be the same as or similar to those described above with respect to the etch stop layer 138 and the ILD layer 140 of FIG. 1G.

Figure 2B:
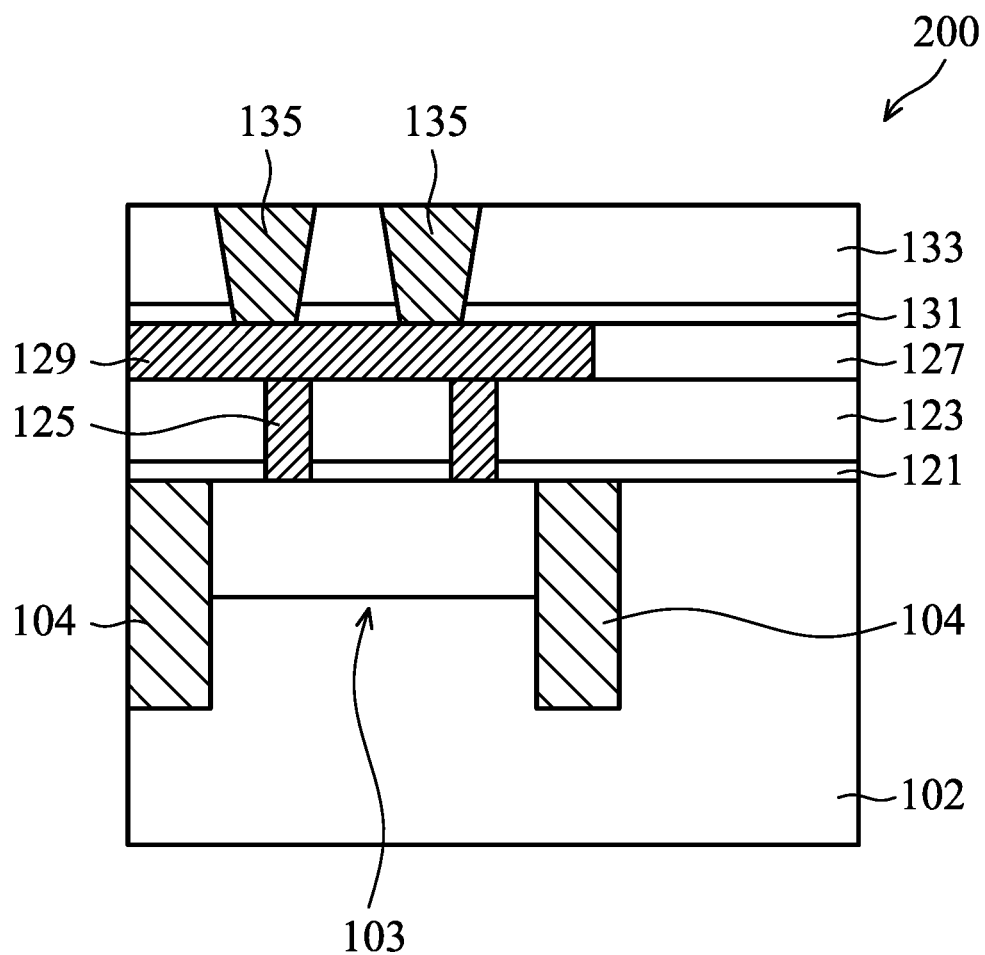

Afterwards, multiple vias 135 are formed in the ILD layer 133 and pass through the etch stop layer 131, as shown in FIG. 2B in accordance with some embodiments. The material and process of forming the vias 135 may be the same as or similar to those described above with respect to the via contacts 142S, 142D and 144 of FIG. 1H. In some examples, the vias 135 may have the same dimension such as the width. A planarization process, for example a CMP process, is performed on the ILD layer 133 and the deposited material layer for forming the vias 135. Thereafter, the top surfaces of the vias 135 are coplanar with the top surface of the ILD layer 133.

Figure 2C:
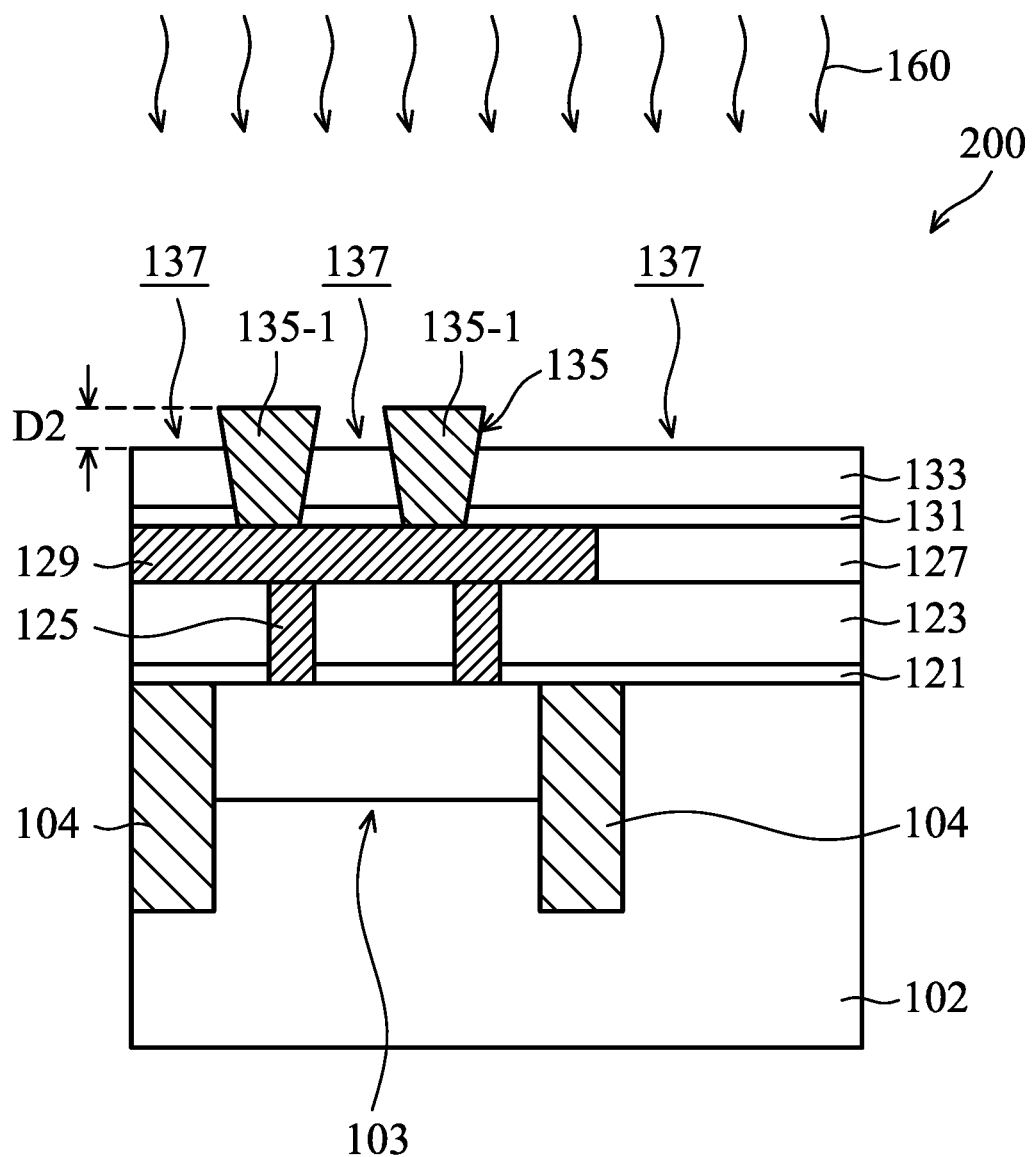

Next, the ILD layer 133 is etched back to expose upper portions 135-1 of the vias 135, as shown in FIG. 2C in accordance with some embodiments. The ILD layer 133 is etched back using an etching process 160 for forming multiple recesses 137 between the vias 135. In some examples, the recesses 137 have a depth D2 that is in a range from about 0.1 nm to about 50 nm. According to embodiments of the disclosure, the vias 135 have the upper portions 135-1 that are raised relative to the ILD layer 133 and the raised vias 135 may be referred to as sawtooth vias. In the embodiments, the raised vias 135 (also referred to as sawtooth vias) are disposed in an interconnect structure and between two metal layers of the interconnect structure to provide a vertically electrical connection.

The etching process 160 may be anisotropic and is selective to the material of the ILD layer 133. In some examples, the etching process 160 may be a dry etching process that includes atomic layer etch (ALE), reactive ion etch (RIE), neutral beam etch (NBE), or a combination thereof. The dry etching process may be performed with fluorine-based plasma and uses etch gases, such as $C_4F_8$, $C_4F_6$, $CF_4$, $CHF_3$, $CH_2F_2$, $CH_3F$ or a combination thereof. In some examples, the etching process 160 may be a wet etching process using a fluoride-based aqueous etch solution, such as diluted HF.

Figure 2D:
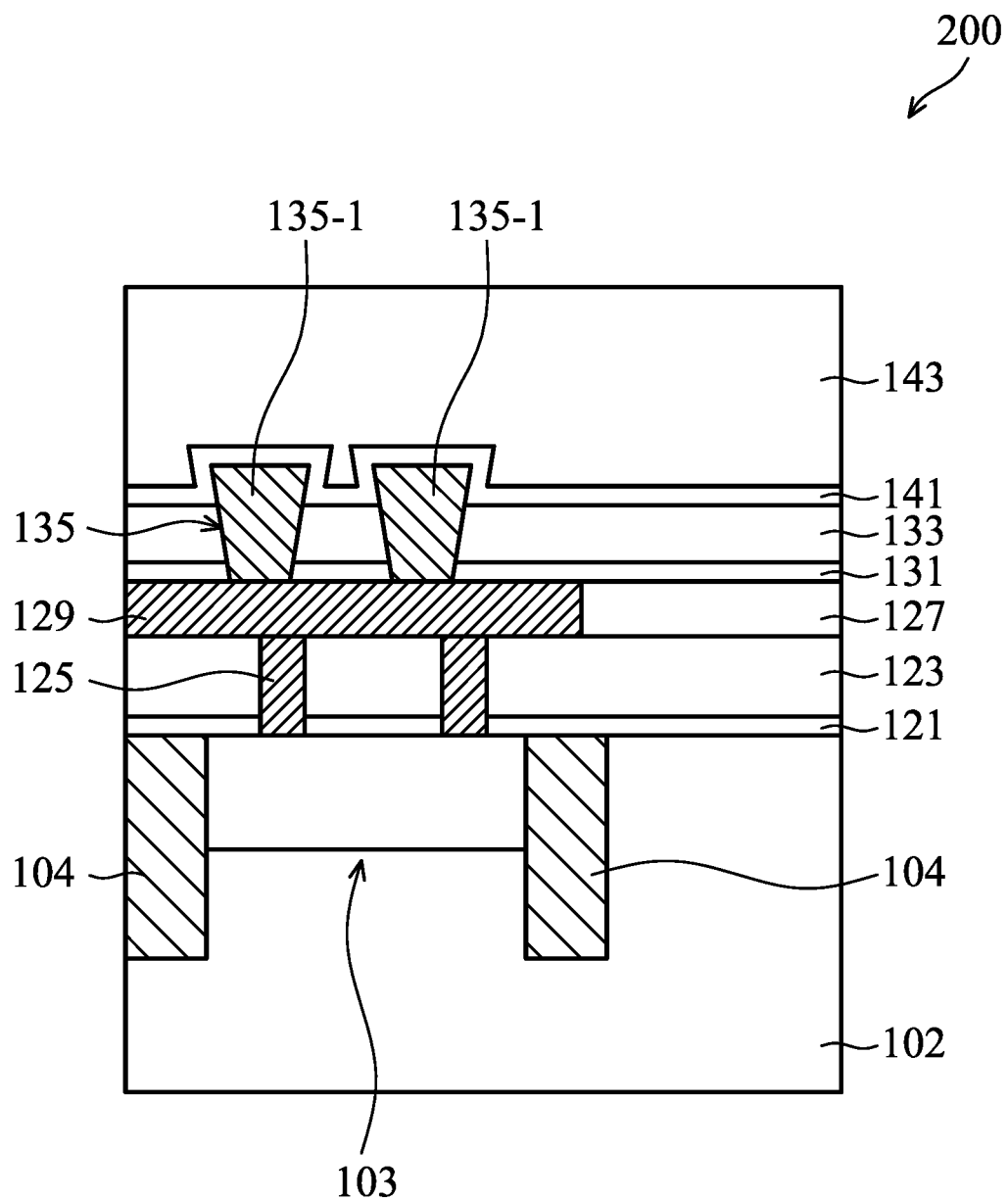

Thereafter, an etch stop layer 141 is deposited on the raised vias 135 and the ILD layer 133, as shown in FIG. 2D in accordance with some embodiments. The etch stop layer 141 is conformally deposited on the top surfaces and the sidewalls of the upper portions 135-1 of the vias 135. The etch stop layer 141 is also raised relative to the top surface of the ILD layer 133. In some examples, the etch stop layer 141 may be a single-layered or multiple-layered dielectric layer. In some examples, the etch stop layer 141 has a thickness that is in a range from about 0.1 nm to about 20 nm Next, an IMD layer 143 is deposited on the etch stop layer 141.

The material of the etch stop layer 141 is different from the materials of the ILD layer 133 and the IMD layer 143. The etch stop layer 141 has an etch selectivity to the ILD layer 133. In some examples, the etch selectivity is in a range from greater than about 1 to about 100. In some embodiments, the etch stop layer 141 is made of a high-k dielectric material that has a k-value greater than about 5. The material of the etch stop layer 141 includes a nitrogen-containing oxide, a metal oxide, or a combination thereof. The metal oxide is for example aluminum (Al)-containing oxide, hafnium (He-containing oxide, tantalum (Ta)-containing oxide, titanium (Ti)-containing oxide, zirconium (Zr)-containing oxide, lanthanum (La)-containing oxide, or a combination thereof. In some embodiments, the etch stop layer 141 is made of SiON, $Ta_2O_5$, $Al_2O_3$, or a combination thereof. The etch stop layer 141 may be deposited by CVD, PECVD, ALD, or another deposition technique. In addition, the material and process of forming the IMD layer 143 may be the same as or similar to those described above with respect to the IMD layer 150 of FIG. 1K. The etching rate of the etch stop layer 141 may be similar to that of the IMD layer 143.

Figure 2E:
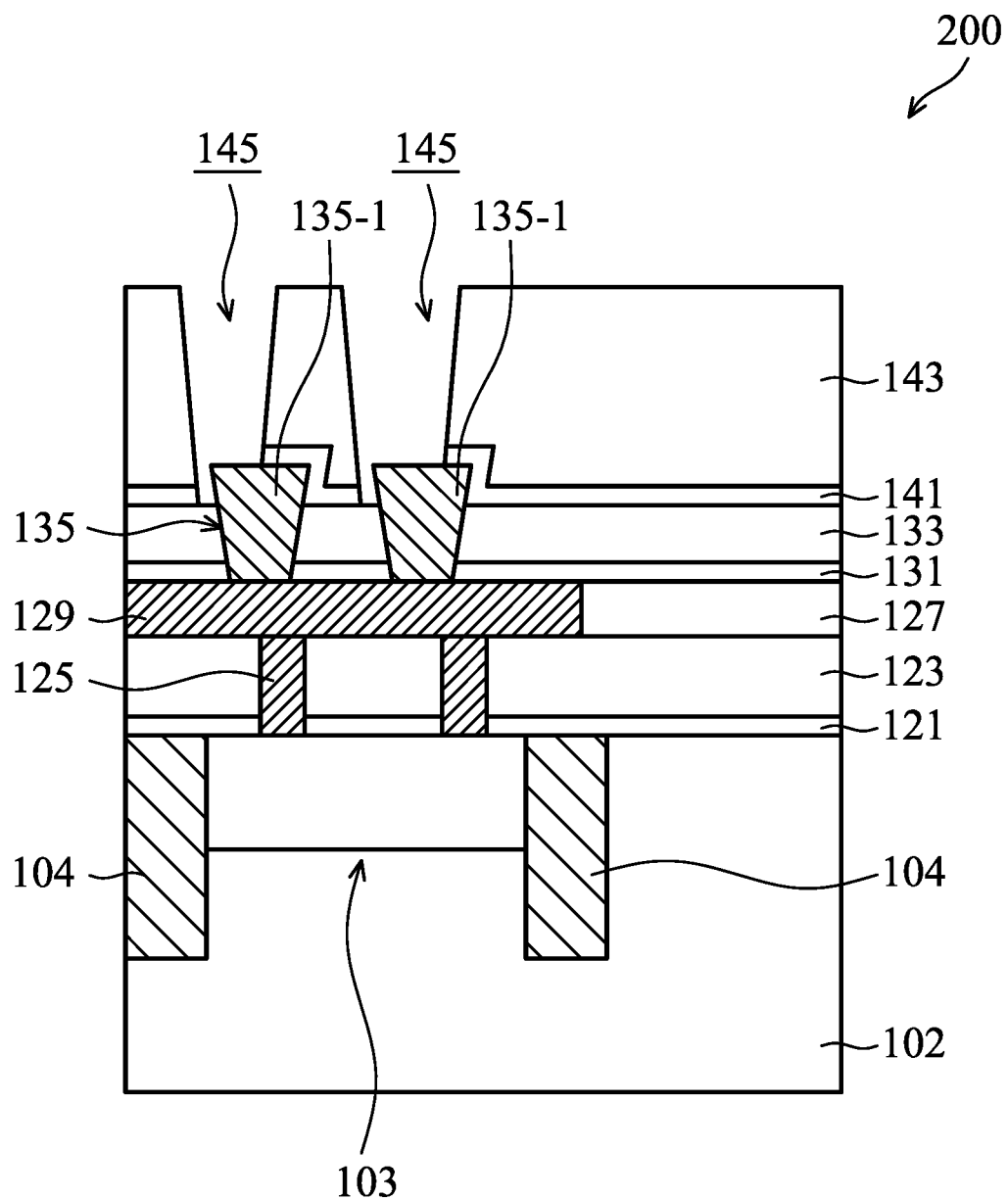

Next, multiple openings 145 are formed in the IMD layer 143 and pass through the etch stop layer 141, as shown in FIG. 2E in accordance with some embodiments. The openings 145 are formed to expose the vias 135, respectively. In some embodiments, a partial top surface and a sidewall of the upper portion 135-1 of the via 135 is exposed through the opening 145. The openings 145 may be formed using photolithography and etching processes as those described above with respect to the openings 152-1, 152-2 and 152-3 of FIG. 1L.

Figure 2F:
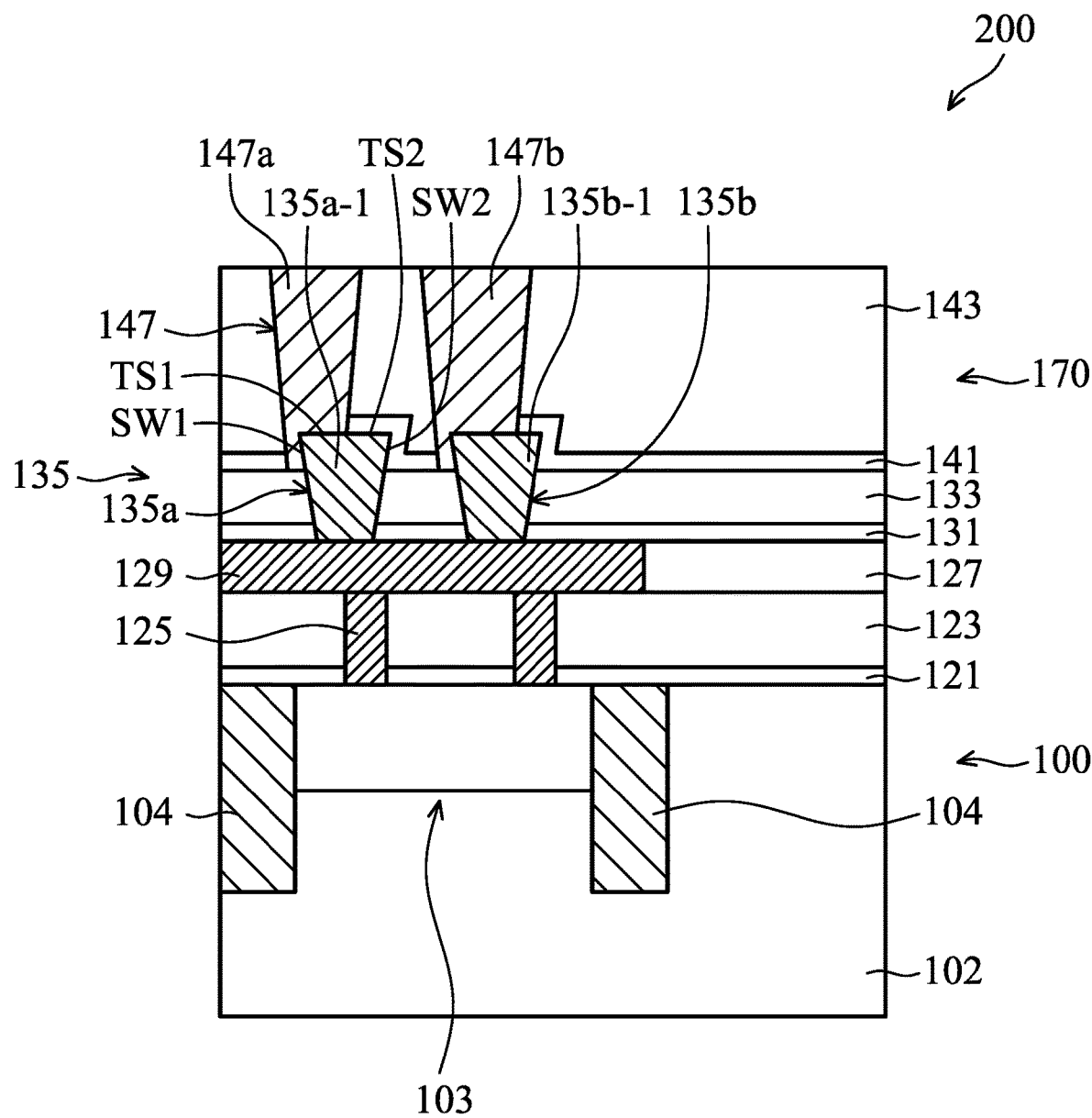

Thereafter, the openings 145 are filled with a metal-containing material to form metal lines 147a and 147b, as shown in FIG. 2F in accordance with some embodiments. The metal lines 147a and 147b are in the same level metal layer, for example a second metal layer (M2) 147 of an interconnect structure 170. The interconnect structure 170 further includes multiple-level metal layers, multiple-level dielectric layers, and multiple-level vias formed above the second metal layer (M2) 147. A dielectric layer is disposed between two metal layers in the interconnect structure 170. Multiple vias are disposed in the dielectric layer and provide an electrical connection between the two metal layers. The interconnect structure 170 is disposed over a semiconductor device 100 to complete the integrated circuit device 200.

The material and process of forming the metal lines 147a and 147b may be the same as or similar to those described above with respect to the metal lines 154-1, 154-2 and 154-3 of FIG. 1M. The metal line 147a is in contact with a first part TS1 of the top surface and a first sidewall SW1 of the upper portion 135a-1 of the via 135a. The etch stop layer 141 is conformally disposed on a second part TS2 of the top surface and a second sidewall SW2 of the upper portion 135a-1 of the via 135a. In some embodiments, the metal line 147b is also in contact with a partial top surface and a sidewall of the upper portion 135b-1 of the via 135b. The etch stop layer 141 is conformally deposited on another partial top surface and another sidewall of the upper portion 135b-1 of the via 135b.

According to the embodiments of the disclosure, the raised vias 135 can increase the contact area between a metal line and a via directly under the metal line. For example, the contact area between the metal line 147a and the via 135a, and the contact area between the metal line 147b and the via 135b are increased compared to vias that are entirely embedded in an ILD layer. According to the embodiments of the disclosure, the contact resistance (Rc) between a metal line and a via in the interconnect structure 170 is thereby reduced.

Moreover, in some embodiments of the disclosure, the space between a via and an adjacent metal line in the interconnect structure 170, for example the space between the via 135a and the metal line 147b, is enlarged due to the raised vias 135. Therefore, the electrical isolation between the via and the adjacent metal line in the interconnect structure 170 is improved. A bridge between the via and the adjacent metal line in the interconnect structure 170 is thereby prevented. Therefore, the probability of short circuit in the integrated circuit devices of the disclosure is significantly reduced.

In addition, according to the embodiments of the disclosure, using an etching-back process on an ILD layer to form the raised vias, the raised via contacts or a combination thereof can reduce the height of a chip. Moreover, the space between a via (or via contact) and an adjacent metal line is enlarged due to the raised vias (or via contacts) of the embodiments of the disclosure. According to the benefits mentioned above, the embodiments of the disclosure are suitable for integrated circuit devices at technology nodes of sub-20 nm, such as 16 nm (N16) to 7 nm (N7) and beyond.

In some embodiments, a method for manufacturing a semiconductor structure is provided. The method includes forming a first conductive structure over a substrate and forming a second conductive structure through a dielectric layer over the first conductive structure. The method further includes partially removing the dielectric layer to reduce a thickness of the dielectric layer along a first direction and forming a third conductive structure over the second conductive structure. In addition, a first portion of the third conductive structure is within a projection area of the second conductive structure along the first direction, and a second portion of the third conductive structure is outside the projection area of the second conductive structure along the first direction, and a first bottom surface of the first portion is spaced apart from a second bottom surface of the second portion by a distance along the first direction.

In some embodiments, a method of manufacturing a semiconductor structure is provided. The method includes forming a first conductive structure over a substrate and forming a second conductive structure through in a dielectric layer and electrically connected to the first conductive structure. The method further includes thinning the dielectric layer to form a recess and forming a material layer in the recess. The method further includes forming a third conductive structure over the second conductive structure. In addition, the third conductive structure has a first portion in contact with a top surface of the second conductive structure and a second portion protruding from a sidewall the second conductive structure.

In some embodiments, a semiconductor structure is provided. The semiconductor structure includes a first dielectric layer formed over a substrate and a first conductive structure formed through the first dielectric layer. The semiconductor structure further includes a second dielectric layer formed over the first dielectric layer and a second conductive structure formed through the second dielectric layer. The semiconductor structure further includes a third conductive structure formed over the second conductive structure. In addition, the third conductive structure includes a first sidewall and a second sidewall opposite to the first sidewall, and the second sidewall is outside an projection area of the second conductive structure and has a second vertical dimension that is different from a first vertical dimension of the first sidewall.

In some embodiments, a method of fabricating an integrated circuit device is provided. The method includes a transistor formed on a substrate. The transistor includes a source region, a drain region, and a gate structure between the source region and the drain region. The integrated circuit device also includes a first dielectric layer over the transistor. The integrated circuit device further includes a first via contact partially in the first dielectric layer and electrically connected to the source region. In addition, the integrated circuit device includes a second via contact partially in the first dielectric layer and electrically connected to the gate structure. An upper portion of the first via contact and an upper portion of the second via contact protrude from the first dielectric layer.

In some embodiments, an interconnect structure for a semiconductor device is provided. The interconnect structure includes a first metal layer over the semiconductor device, and a first dielectric layer over the first metal layer. The interconnect structure also includes a first via and a second via partially in the first dielectric layer and protruding from the first dielectric layer. The first via and the second via are connected to the first metal layer. The interconnect structure further includes an etch stop layer conformally on a first sidewall and a first part of a top surface of the first via, and on the first dielectric layer. In addition, the interconnect structure includes a second dielectric layer on the etch stop layer, and a first metal line and a second metal line in the second dielectric layer. The first metal line and the second metal line pass through the etch stop layer to be in contact with the first via and the second via, respectively.

In some embodiments, a method of fabricating an integrated circuit device is provided. The method includes depositing a first dielectric layer over a semiconductor substrate, and forming a first via contact and a second via contact embedded in the first dielectric layer. The method also includes etching back the first dielectric layer to expose an upper portion of the first via contact and an upper portion of the second via contact. The method further includes depositing an etch stop layer conformally on the upper portion of the first via contact, on the upper portion of the second via contact and on the first dielectric layer. In addition, the method includes depositing a second dielectric layer on the etch stop layer, and forming a first metal line and a second metal line in the second dielectric layer to be electrically connected to the first via contact and the second via contact, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    forming a first conductive structure over a substrate;
    forming a second conductive structure through a dielectric layer over the first conductive structure;
    partially removing the dielectric layer to reduce a thickness of the dielectric layer along a first direction; and
    forming a third conductive structure over the second conductive structure, wherein a first portion of the third conductive structure is within a projection area of the second conductive structure along the first direction, and a second portion of the third conductive structure is outside the projection area of the second conductive structure along the first direction, and a first bottom surface of the first portion is spaced apart from a second bottom surface of the second portion by a distance along the first direction,
    wherein a first sidewall of the second conductive structure and a second sidewall of the second conductive structure opposite to the first sidewall of the second conductive structure are both in contact with the third conductive structure in a second direction that is different from the first direction.

2. The method of manufacturing the semiconductor structure as claimed in claim 1, wherein the third conductive structure includes a first sidewall and a second sidewall both outside the projection area of the second conductive structure.

3. The method of manufacturing the semiconductor structure as claimed in claim 1, wherein the first portion and the second portion of the third conductive structure have different thicknesses along the first direction.

4. The method of manufacturing the semiconductor structure as claimed in claim 1, wherein the first bottom surface is substantially level with a top surface of the second conductive structure.

5. The method of manufacturing the semiconductor structure as claimed in claim 1, further comprising:
    forming a material layer over the dielectric layer after partially removing the dielectric layer and before forming the third conductive structure, wherein the material layer has an opening exposing a top surface of the second conductive structure, and the third conductive structure is formed in the opening of the material layer.

6. The method of manufacturing the semiconductor structure as claimed in claim 5, wherein a thickness of the third conductive structure along the first direction is greater than a thickness of the material layer along the first direction.

7. The method of manufacturing the semiconductor structure as claimed in claim 1, wherein a first sidewall and a second sidewall of the third conductive structure are at opposite sides of the first sidewall and the second sidewall of the second conductive structure and are in contact with a top surface of the dielectric layer.

8. A method of manufacturing a semiconductor structure, comprising:
    forming a first conductive structure over a substrate;
    forming a second conductive structure through a dielectric layer and electrically connected to the first conductive structure;
    thinning the dielectric layer to form a recess;
    forming a material layer in the recess; and
    forming a third conductive structure over the second conductive structure,
    wherein the third conductive structure has a central portion in contact with a top surface of the second conductive structure, a first protruding portion at a first side of the central portion and protruding from a first sidewall of the second conductive structure, and a second protruding portion at a second side of the central portion opposite to the first protruding portion, and a bottom surface of the second protruding portion of the third conductive structure is substantially level with a bottom surface of the material layer.

9. The method of manufacturing the semiconductor structure as claimed in claim 8, wherein an interface between the material layer and the third conductive structure is outside a projection area of the second conductive structure.

10. The method of manufacturing the semiconductor structure as claimed in claim 8, wherein the central portion, the first protruding portion, and the second protruding portion of the third conductive structure have substantially flat top surfaces.

11. The method of manufacturing the semiconductor structure as claimed in claim 8, wherein the first protruding portion of the third conductive structure vertically overlaps the dielectric layer.

12. The method of manufacturing the semiconductor structure as claimed in claim 8, wherein a bottom surface of the first protruding portion of the third conductive structure is lower than a bottom surface of the central portion of the third conductive structure.

13. The method of manufacturing the semiconductor structure as claimed in claim 8, wherein a first sidewall of the first protruding portion and a second sidewall of the second protruding portion are at opposite sides of the second conductive structure.

14. A method of manufacturing a semiconductor structure, comprising:
   forming a first dielectric layer;
   forming a first conductive structure in the first dielectric layer;
   forming a second dielectric layer over the first dielectric layer;
   forming a second conductive structure through the second dielectric layer, wherein a bottom surface of the second conductive structure is in contact with the first conductive structure; and
   forming a third conductive structure over the second conductive, wherein the third conductive structure has first portion having a first thickness between a first top surface and a first bottom surface, a second portion having a second thickness between a second top surface and a second bottom surface, and a third portion having a third thickness between a third top surface and a third bottom surface, and the first portion, the second portion, and the third portion are all laterally surrounded by a third dielectric layer, and the first portion is laterally sandwiched between the second portion and the third portion, and the first thickness is different from the second thickness and the third thickness, and a first sidewall of the third conductive structure is outside a projection area of the second conductive structure.

15. The method of manufacturing the semiconductor structure as claimed in claim 14, wherein the first bottom surface of the first portion of the third conductive structure is not level with the second bottom surface of the second portion of the third conductive structure.

16. The method of manufacturing the semiconductor structure as claimed in claim 14, wherein the first bottom surface of the first portion of the third conductive structure is higher than a top surface of the second dielectric layer, and the second bottom surface of the second portion of the third conductive structure is substantially level with the top surface of the second dielectric layer.

17. The method of manufacturing the semiconductor structure as claimed in claim 14, further comprising:
   forming a material layer over the second dielectric layer, wherein the
   third dielectric layer is formed over the material layer.

18. The method of manufacturing the semiconductor structure as claimed in claim 17, wherein a bottom surface of the material layer is substantially level with a top surface of the second dielectric layer.

19. The method of manufacturing the semiconductor structure as claimed in claim 14, wherein the second thickness and the third thickness are both greater than the first thickness.

20. The method of manufacturing the semiconductor structure as claimed in claim 14, further comprising:
   forming a fourth conductive structure through the second dielectric layer,
   wherein the fourth conductive structure has a third sidewall facing the first sidewall of the third conductive structure, and a first lateral distance between a bottom edge of the first sidewall of the third conductive structure and the third sidewall of the fourth conductive structure is greater than a second lateral distance between a top edge of the third sidewall of the fourth conductive structure and the first sidewall of the third conductive structure.

\* \* \* \* \*